(12) United States Patent
Yamaguchi et al.

(10) Patent No.: US 11,462,435 B2
(45) Date of Patent: Oct. 4, 2022

(54) ROBOT SYSTEM, ROBOT CONTROLLING METHOD, AND SEMICONDUCTOR MANUFACTURING SYSTEM

(71) Applicant: KABUSHIKI KAISHA YASKAWA DENKI, Fukuoka (JP)

(72) Inventors: Go Yamaguchi, Fukuoka (JP); Hiromitsu Akae, Fukuoka (JP)

(73) Assignee: KABUSHIKI KAISHA YASKAWA DENKI, Fukuoka (JP)

( * ) Notice: Subject to any disclaimer, the term of this patent is extended or adjusted under 35 U.S.C. 154(b) by 0 days.

(21) Appl. No.: 17/090,925

(22) Filed: Nov. 6, 2020

(65) Prior Publication Data

US 2021/0143047 A1    May 13, 2021

(30) Foreign Application Priority Data

Nov. 11, 2019  (JP) .............................. JP2019-203707

(51) Int. Cl.
| | | |
|---|---|---|
| *H01L 21/67* | (2006.01) | |
| *H01L 21/687* | (2006.01) | |
| *B25J 11/00* | (2006.01) | |
| *B25J 9/04* | (2006.01) | |
| *B25J 9/00* | (2006.01) | |

(52) U.S. Cl.
CPC ...... *H01L 21/68707* (2013.01); *B25J 9/0009* (2013.01); *B25J 9/043* (2013.01); *B25J 9/047* (2013.01); *B25J 11/0095* (2013.01); *H01L 21/67167* (2013.01)

(58) Field of Classification Search
None
See application file for complete search history.

(56) References Cited

U.S. PATENT DOCUMENTS

| | | | | |
|---|---|---|---|---|
| 2001/0053324 | A1* | 12/2001 | Saeki | ............... H01L 21/67161 |
| | | | | 29/25.01 |
| 2006/0099063 | A1* | 5/2006 | Pietrantonio | ......... H01L 21/677 |
| | | | | 414/744.5 |
| 2010/0178147 | A1* | 7/2010 | Kremerman | ...... H01L 21/67742 |
| | | | | 414/744.5 |

FOREIGN PATENT DOCUMENTS

| | | |
|---|---|---|
| JP | 2580489 B2 | 2/1997 |
| JP | 2011-045945 A | 3/2011 |
| JP | 4682378 B2 | 5/2011 |
| JP | 4682379 B2 | 5/2011 |
| JP | 5021397 B2 | 9/2012 |
| JP | 6059156 B2 | 1/2017 |
| JP | 6571629 B2 | 9/2019 |

(Continued)

*Primary Examiner* — Ronald P Jarrett
(74) *Attorney, Agent, or Firm* — Venjuris, P.C.

(57) ABSTRACT

A robot includes: a first arm that is a horizontal multi-joint type arm provided with a first base link provided to be rotatable around a pivoting axis, a first intermediate link, and a first hand that holds a workpiece W thereon, and configured to move the first hand along a first diameter direction; a second arm that is a horizontal multi-joint type arm provided with a second base link provided to be independently rotatable from the first base link around the pivoting axis, a second intermediate link, and a second hand that holds the workpiece W thereon, and configured to move the second hand along a second diameter direction, and a pivoting device configured to pivot the first arm and the second arm together in the circumferential direction while maintaining a positional relationship of the first arm and the second arm in the circumferential direction.

16 Claims, 17 Drawing Sheets

(56) References Cited

FOREIGN PATENT DOCUMENTS

| KR | 10-2014-0005893 A | 1/2014 |
| KR | 10-2017-0063957 A | 6/2017 |

* cited by examiner

ROBOT SYSTEM, ROBOT CONTROLLING METHOD, AND SEMICONDUCTOR MANUFACTURING SYSTEM

CROSS-REFERENCE TO RELATED APPLICATIONS

This application is based on and claims priority from Japanese Patent Application No. 2019-203707 filed on Nov. 11, 2019 with the Japan Patent Office, the disclosure of which is incorporated herein in its entirety by reference.

TECHNICAL FIELD

The present disclosure relates to a robot system, a robot controlling method, and a semiconductor manufacturing system.

BACKGROUND

Japanese Laid-Open Patent Publication No. 2011-045945 discloses an industrial robot which transfers a transfer target by pivoting and extending/retracting two horizontal multi-joint type arms.

SUMMARY

According to an aspect of the present disclosure, a robot system includes: a robot; and a robot controller configured to control the robot. The robot includes: a first arm that is a horizontal multi-joint type arm provided with a first base link provided to be rotatable around a pivoting axis, a first intermediate link connected to a tip portion of the first base link to be rotatable around a first rotation axis, and a first hand connected to a tip portion of the first intermediate link to be rotatable around a second rotation axis and formed to be longer in an elongated direction of the first hand than each of the first base link and the first intermediate link thereby holding a workpiece thereon, and configured to move the first hand along a first diameter direction centered on the pivoting axis; a second arm that is a horizontal multi-joint type arm provided with a second base link provided to be independently rotatable from the first base link around the pivoting axis, a second intermediate link connected to a tip portion of the second base link to be rotatable around a third rotation axis, and a second hand connected to a tip portion of the second intermediate link to be rotatable around a fourth rotation axis and formed to be longer in an elongated direction of the second hand than each of the second base link and the second intermediate link thereby holding the workpiece thereon, and configured to move the second hand along a second diameter direction having a preset angle in a circumferential direction of the pivoting axis with respect to the first diameter direction; and a pivoting device configured to pivot the first arm and the second arm together in the circumferential direction while maintaining a positional relationship of the first arm and the second arm in the circumferential direction.

According to another aspect of the present disclosure, a method of controlling a robot includes: preparing a robot including a first arm that is a horizontal multi-joint type arm provided with a first base link provided to be rotatable around a pivoting axis, a first intermediate link connected to a tip portion of the first base link to be rotatable around a first rotation axis, and a first hand connected to a tip portion of the first intermediate link to be rotatable around a second rotation axis and formed to be longer in an elongated direction of the first hand than each of the first base link and the first intermediate link thereby holding a workpiece thereon, and configured to move the first hand along a first diameter direction centered on the pivoting axis, a second arm that is a horizontal multi-joint type arm provided with a second base link provided to be independently rotatable from the first base link around the pivoting axis, a second intermediate link connected to a tip portion of the second base link to be rotatable around a third rotation axis, and a second hand connected to a tip portion of the second intermediate link to be rotatable around a fourth rotation axis and formed to be longer in an elongated direction of the second hand than each of the second base link and the second intermediate link thereby holding the workpiece thereon, and configured to move the second hand along a second diameter direction having a preset angle in a circumferential direction of the pivoting axis with respect to the first diameter direction, a pivoting device configured to pivot the first arm and the second arm together in the circumferential direction while maintaining a positional relationship of the first arm and the second arm in the circumferential direction, and an elevation device configured to move the first arm and the second arm together up and down in an axial direction of the pivoting axis while maintaining the positional relationship of the first arm and the second arm in the circumferential direction; and moving the first arm and the second arm up and down in the axial direction simultaneously with pivoting the first arm and the second arm in the circumferential direction.

According to another aspect of the present disclosure, a semiconductor manufacturing system includes: a first chamber in which a robot for transferring a semiconductor wafer is disposed; and a plurality of second chambers arranged around the first chamber and configured to perform a preset processing on the semiconductor wafer. The robot includes a first arm that is a horizontal multi-joint type arm provided with a first base link provided to be rotatable around a pivoting axis, a first intermediate link connected to a tip portion of the first base link to be rotatable around a first rotation axis, and a first hand connected to a tip portion of the first intermediate link to be rotatable around a second rotation axis and formed to be longer in an elongated direction of the first hand than each of the first base link and the first intermediate link thereby holding a workpiece thereon, and configured to move the first hand along a first diameter direction centered on the pivoting axis, a second arm that is a horizontal multi-joint type arm provided with a second base link provided to be independently rotatable from the first base link around the pivoting axis, a second intermediate link connected to a tip portion of the second base link to be rotatable around a third rotation axis, and a second hand connected to a tip portion of the second intermediate link to be rotatable around a fourth rotation axis and formed to be longer in an elongated direction of the second hand than each of the second base link and the second intermediate link thereby holding the workpiece thereon, and configured to move the second hand along a second diameter direction having a preset angle in a circumferential direction of the pivoting axis with respect to the first diameter direction, and a pivoting device configured to pivot the first arm and the second arm together in the circumferential direction while maintaining a positional relationship of the first arm and the second arm in the circumferential direction.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings which form a part hereof. The illustrative embodiments described in the detailed description, drawings, and claims are not meant to be limiting. Other embodiments may be utilized, and other changes may be made without departing from the spirit or scope of the subject matter presented herein.

In order to implement a downsizing of a robot system, it is required to reduce a pivoting radius of an arm while ensuring the reach of the arm as long as possible. However, in the related art described above, when the pivoting radius is reduced while ensuring the reach of the arm, the downsizing may be restricted because when one arm is extended, the one arm and a workpiece held by the other arm may interfere with each other.

An embodiment of the present disclosure has been made in consideration of the problem described above, and relates to providing a robot system, a robot controlling method, and a semiconductor manufacturing system which are capable of reducing the pivoting radius while ensuring the reach of the arm.

Hereinafter, an embodiment of the present disclosure will be described with reference to the accompanying drawings.

1. Configuration of Robot System

Figure 1:
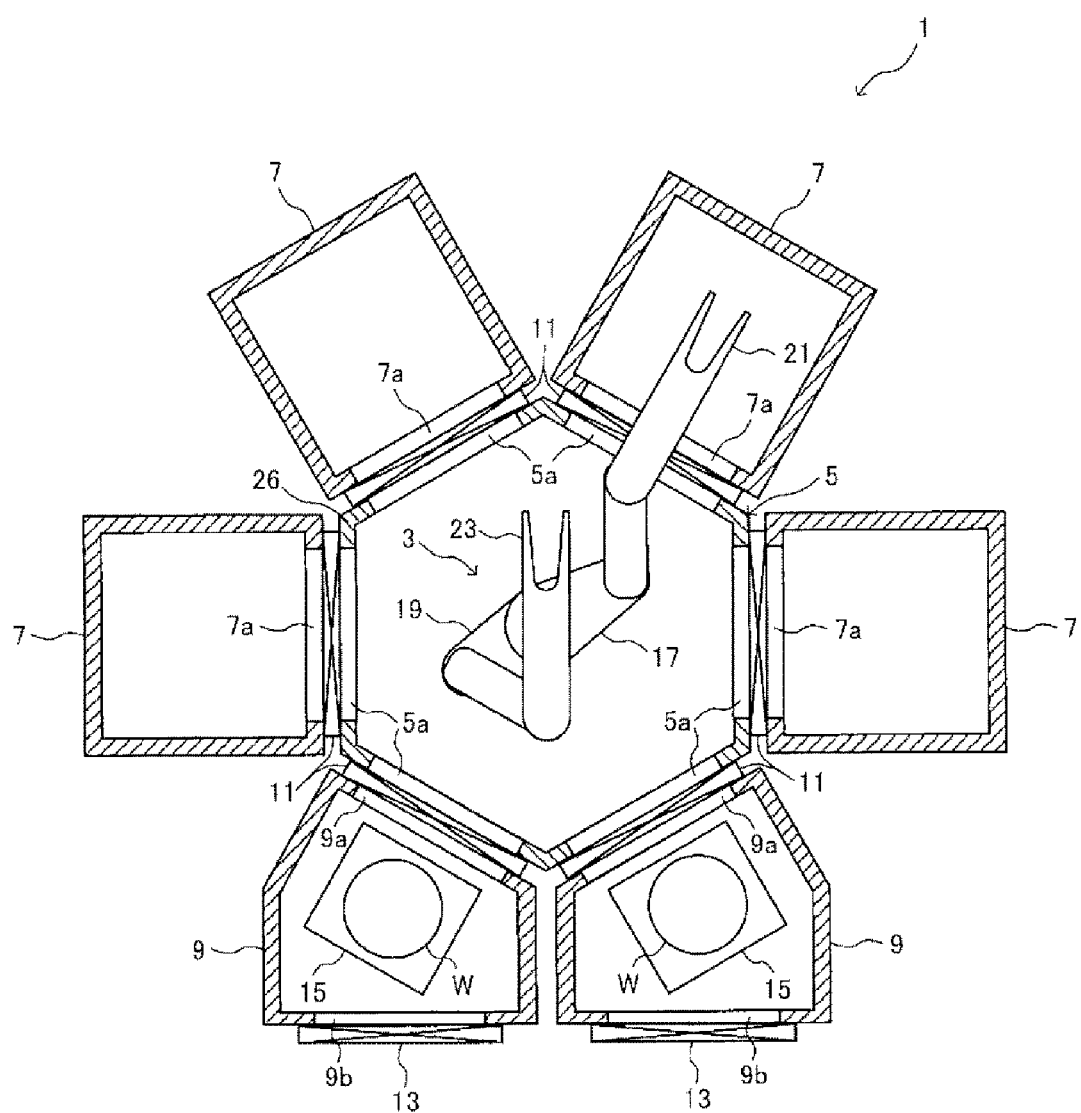
FIG. 1 is a conceptual view illustrating an example of a schematic configuration of a robot system.

First, an example of a configuration of a robot system 1 according to an embodiment of the present disclosure will be described with reference to FIG. 1. FIG. 1 is a conceptual view illustrating an example of a schematic configuration of the robot system 1.

The robot system 1 is a workpiece processing system that includes a robot 3 configured to transfer a workpiece W under a vacuum environment, and is applicable to various applications such as, for example, a semiconductor manufacturing system and a liquid crystal manufacturing system. In the present embodiment, descriptions will be made on a case where the robot system 1 is a semiconductor manufacturing system that processes semiconductor wafers.

As illustrated in FIG. 1, the robot system 1 includes the robot 3, a transfer chamber 5, processing chambers 7, and cassette chambers 9. The robot system 1 is a multi-chamber type processing system that continuously processes workpieces W which are semiconductor wafers, one by one.

The transfer chamber 5 (e.g., a first chamber) has, for example, a substantially hexagonal shape when viewed from above, and the robot 3 is disposed therein. The processing chambers 7 and the cassette chambers 9 are arranged around the transfer chamber 5 to surround the transfer chamber 5. In each processing chamber 7 (e.g., a second chamber), a predetermined processing is performed on a workpiece W, and in each cassette chamber 9, carry-in/out of a workpiece W are performed. The transfer chamber 5 has a plurality of connection ports 5a each opened in a predetermined size, each processing chamber 7 has a connection port 7a opened in a predetermined size, and each cassette chamber 9 has a connection port 9a opened in a predetermined size. The connection ports 5a are connected to the connection ports 7a and 9a by openable/closable gate valves 11, respectively. Further, each cassette chamber 9 has an opening 9b opened outward, and is sealed by an openable/closable gate valve 13. With this configuration, the transfer chamber 5, the processing chambers 7, and the cassette chambers 9 may be maintained in a hermetic state from each other.

The transfer chamber 5 and each processing chamber 7 are brought into a state of being depressurized to a predetermined pressure lower than an atmospheric pressure (also referred to as a vacuum state). In the cassette chamber 9, the vacuum state and the atmospheric pressure state are appropriately repeated. That is, when the gate valve 13 is opened to carry a workpiece cassette 15 into the cassette chamber 9 from the outside, the cassette chamber 9 goes to the atmospheric pressure state. Meanwhile, when the gate valve 11 is opened to connect the cassette chamber 9 to the transfer chamber 5, the cassette chamber 9 is depressurized to a pressure substantially equal to the pressure of the transfer chamber 5 and goes to the vacuum state. In the workpiece cassette 15, support shelves (not illustrated) may be provided at equal intervals, and unprocessed or processed workpieces W are stored in multiple stages.

The robot 3 is a scalar robot that includes a first arm 17 and a second arm 19 which are horizontal multi-joint type arms, and is disposed substantially at the center of the transfer chamber 5. The first arm 17 includes a first hand 21 at the tip thereof, and the second arm 19 includes a second hand 23 at the tip thereof. The robot 3 pivots and extends/retracts the first arm 17 and the second arm 19, thereby loading workpieces W on the first hand 21 and the second hand 23 and transferring the workpieces W to desired positions. Specifically, the robot 3 pivots the first arm 17 and the second arm 19 together in a state where both the first arm 17 and the second arm 19 are retracted, using a pivoting device 24 (see, e.g., FIG. 6 to be described later). Further, the robot 3 extends/retracts the first arm 17 or the second arm 19 in a state where a predetermined gate valve 11 is opened, thereby allowing the first hand 21 or the second hand 23 to enter/exit from the processing chamber 7 or the cassette chamber 9 through the connection ports 5a and 7a or 9a. At this time, the workpiece W is taken out from the processing chamber 7 or the cassette chamber 9 by being loaded on the first hand 21 or the second hand 23. Meanwhile, the workpiece W is taken into the processing chamber 7 or the cassette chamber 9 by being unloaded from the first hand 21 or the second hand 23.

Further, the robot 3 moves the first arm 17 and the second arm 19 up and down, using an elevation device 25 (see, e.g., FIG. 6 to be described later). By moving the first hand 21 and the second hand 23 up and down, the workpiece W may be lifted from or placed on, for example, a processing shelf 7b of the processing chamber 7 (see, e.g., FIG. 9 to be described later) or a support shelf of the workpiece cassette 15. Further, by moving the first hand 21 and the second hand 23 up and down, the height positions of the first hand 21 and the second hand 23 may be adjusted with respect to, for example, the connection port 5a connected to the connection port 7a of a predetermined processing chamber 7 or a support shelf disposed at a specific position in the workpiece cassette 15.

The transfer chamber 5 includes walls 26 each disposed between the adjacent connection ports 5a. The walls 26 are arranged such that, in a state where the robot 3 is pivoted by an angle at which the processing chamber 7 or the cassette chamber 9 is positioned in front of the robot 3 in any one direction of a movement direction of the first hand 21 (e.g., a first diameter direction D1; see, e.g., FIGS. 2 and 4 to be described later) and a movement direction of the second hand 23 (e.g., a second diameter direction D2; see, e.g., FIGS. 2 and 5 to be described later), a wall 26 is positioned in front of the robot 3 in the other direction. In other words, an angular interval at which the processing chambers 7 are arranged (e.g., 60°) is different from an angle difference θ between the first diameter direction D1 and the second diameter direction D2 (e.g., 30°). For example, in the example illustrated in FIG. 1, the robot 3 is pivoted by an angle at which the processing chamber 7 is positioned in front of the robot 3 in the movement direction of the first hand 21 of the first arm 17 (e.g., the first diameter direction D1), and in this state, a wall 26 is positioned in front of the robot 3 in the movement direction of the second hand 23 of the second arm 19 (e.g., the second diameter direction D2). When the robot 3 extends the second arm 19 in this state, the second hand 23 comes into contact with the wall 26.

The configuration of the robot system 1 described above is an example, and the present disclosure is not limited to the configuration described above. For example, the shape of the transfer chamber 5 may be a polygon other than a hexagon (e.g., a triangle, a quadrangle, a pentagon or an octagon). In this case, the number or the arrangement of the processing chambers 7 or the cassette chambers 9 is appropriately changed according to the shape of the transfer chamber 5.

2. External Structure of Robot

Figure 2:
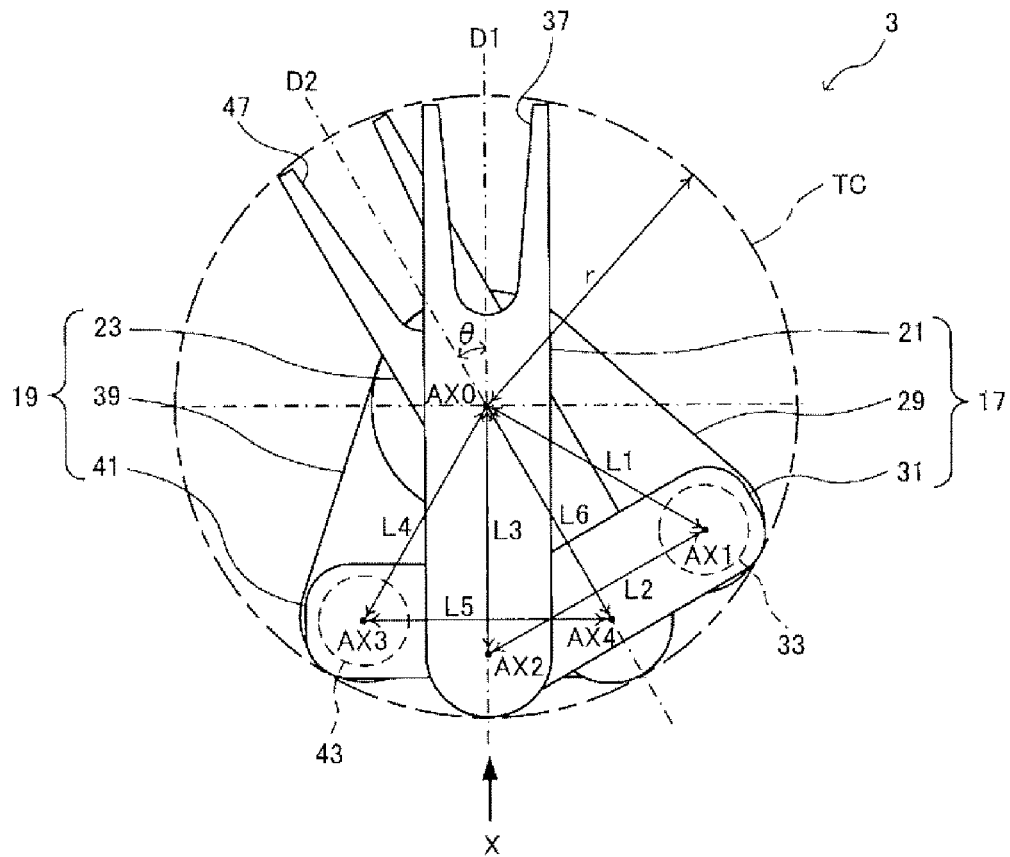
FIG. 2 is a top view illustrating an example of a state where a robot retracts a first arm and a second arm.
Figure 3:
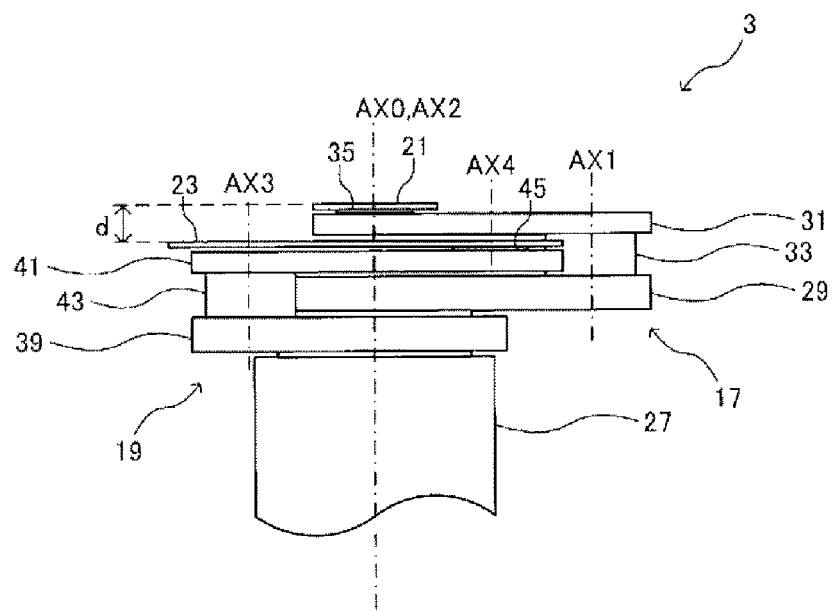
FIG. 3 is a side view illustrating the example of the state where the robot retracts the first arm and the second arm, when viewed from a direction of an arrow X in FIG. 2.
Figure 4:
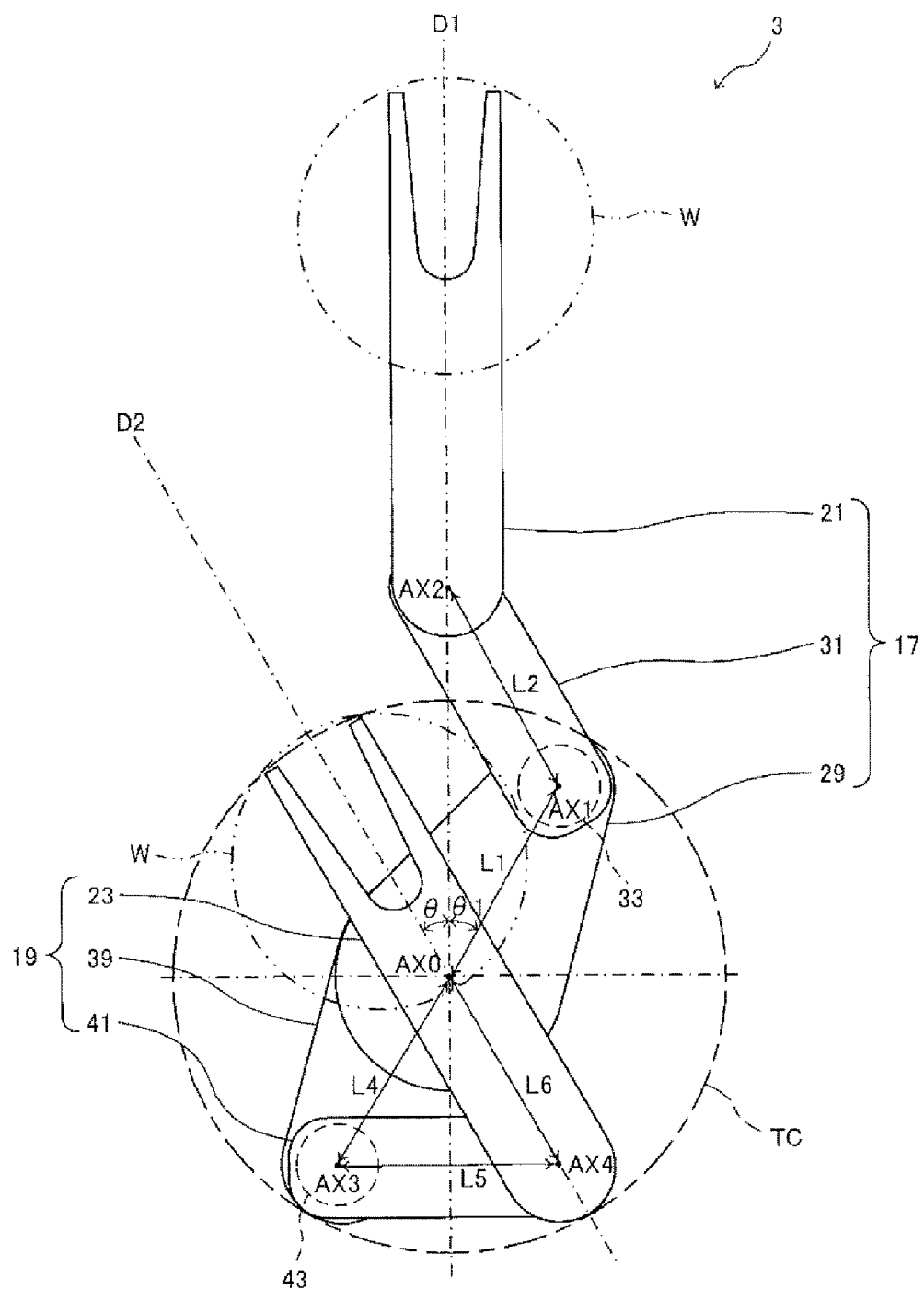
FIG. 4 is a top view illustrating an example of a state where the robot extends the first arm.
Figure 5:
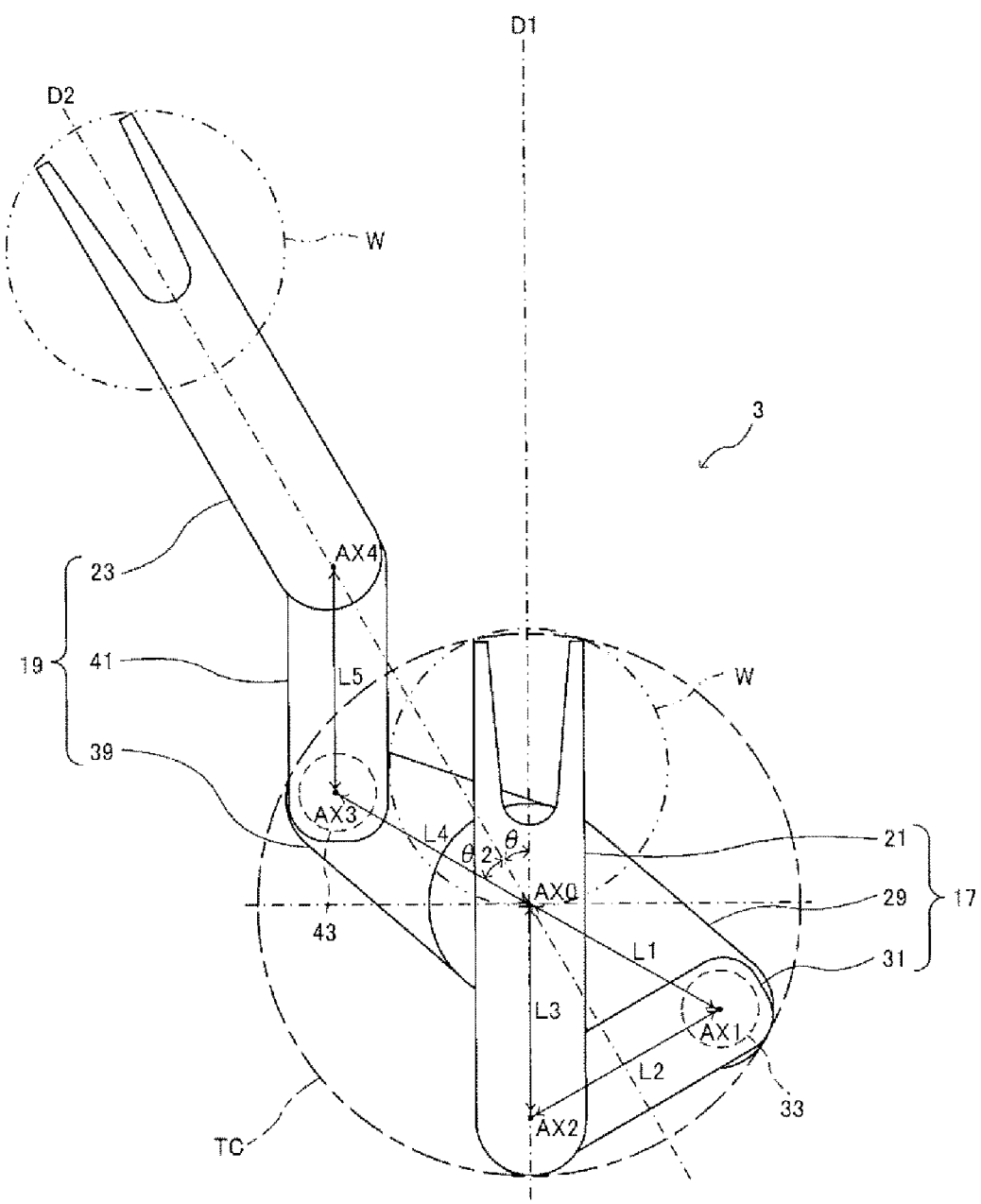
FIG. 5 is a top view illustrating an example of a state where the robot extends the second arm.

Next, an example of the external structure of the robot 3 will be described with reference to FIGS. 2 to 5. FIG. 2 is a top view illustrating an example of a state where the robot 3 retracts the first arm 17 and the second arm 19, and FIG. 3 is a side view illustrating the example of the state where the robot 3 retracts the first arm 17 and the second arm 19, when viewed from the direction of the arrow X in FIG. 2. FIG. 4 is a top view illustrating an example of a state where the robot 3 extends the first arm 17, and FIG. 5 is a top view illustrating an example of a state where the robot 3 extends the second arm 19.

As illustrated in FIGS. 2 and 3, the robot 3 includes a base 27, the first arm 17, and the second arm 19. The base 27 is a substantially cylindrical member, and supports the first arm 17 and the second arm 19 to be pivotable and extendable/retractable. The base 27 is provided with, for example, three motors therein which are driving sources for the extension/retraction operation of the first arm 17, the extension/retraction operation of the second arm 19, and the pivoting operation of the first arm 17 and the second arm 19 by the pivoting device 24 (see, e.g., FIG. 6 to be described later).

The first arm 17 is a horizontal multi-joint type arm that includes a first base link 29, a first intermediate link 31, and the first hand 21, and moves the first hand 21 along the first diameter direction D1 centered on a pivoting axis AX0. The first base link 29 is provided on the top of the base 27 (e.g., the top of a second base link 39 of the second arm 19; see, e.g., FIG. 3) to be rotatable around the pivoting axis AX0. The first intermediate link 31 is connected to the tip portion of the first base link 29 via a connection member 33 to be rotatable around a first rotation axis AX1. As illustrated in FIG. 3, with the interposition of the connection member 33, a gap is formed between the first base link 29 and the first intermediate link 31, which is slightly larger than the dimension of a second intermediate link 41, a connection member 45, and the second hand 23 of the second arm 19 (including the workpiece W loaded on the second hand 23) in the height direction. The first hand 21 is connected to the tip portion of the first intermediate link 31 via a connection member 35 to be rotatable around a second rotation axis AX2. A notch 37 is formed at the tip portion of the first hand 21 to lift or place the workpiece W from or on, for example, the processing shelf 7b of the processing chamber 7 (see, e.g., FIG. 9 to be described later) or the support shelf of the workpiece cassette 15.

The second arm 19 is a horizontal multi-joint type arm that includes the second base link 39, the second intermediate link 41, and the second hand 23, and moves the second hand 23 along the second diameter direction D2 centered on the pivoting axis AX0. The second diameter direction D2 has a predetermined angle θ with respect to the first diameter direction D1 in the circumferential direction of the pivoting axis AX0. The angle θ is set to an angle difference that corresponds to a range in which the first arm 17 and the second arm 19 are pivotable during a time required to move the robot 3 up or down by a vertical offset distance "d" between the first hand 21 and the second hand 23 (see, e.g., FIG. 3), using the elevation device 25 to be described later (see, e.g., FIG. 6) (e.g., 30° but may be an angle other than 30°).

The second base link 39 is provided on the top of the base 27 to be rotatable around the pivoting axis AX0. The second intermediate link 41 is connected to the tip portion of the second base link 39 via a connection member 43 to be rotatable around a third rotation axis AX3. As illustrated in FIG. 3, with the interposition of the connection member 43, a gap is formed between the second base link 39 and the second intermediate link 41, which is slightly larger than the dimension of the first base link 29 of the first arm 17 in the height direction. The second hand 23 is connected to the tip portion of the second intermediate link 41 via the connection member 45 to be rotatable around a fourth rotation axis AX4. A notch 47 is formed at the tip portion of the second hand 23 to lift or place the workpiece W from or on, for example, the processing shelf 7b of the processing chamber 7 (see, e.g., FIG. 9 to be described later) or the support shelf of the workpiece cassette 15.

When the first arm 17 and the second arm 19 are pivoted by the pivoting device 24, the first arm 17 and the second arm 19 are brought into the pivoting posture illustrated in FIG. 2 by a robot controller 113 (see, e.g., FIG. 7) to be described later. In the pivoting posture, the first arm 17 has a posture in which the second rotation axis AX2 of the first hand 21 is positioned opposite to the tip of the first hand 21 with respect to the pivoting axis AX0 when viewed from the axial direction of the pivoting axis AX0. Further, the second arm 19 has a posture in which the fourth rotation axis AX4 of the second hand 23 is positioned opposite to the tip of the second hand 23 with respect to the pivoting axis AX0 when viewed from the axial direction of the pivoting axis AX0. Further, in the pivoting posture, the first arm 17 and the second arm 19 have a posture in which the second rotation axis AX2 is positioned between the fourth rotation axis AX4 and the third rotation axis AX3 in the circumferential direction, and the fourth rotation axis AX4 is positioned between the second rotation axis AX2 and the first rotation axis AX1 in the circumferential direction, when viewed from the axial direction of the pivoting axis AX0.

As illustrated in FIG. 2, the first arm 17 and the second arm 19 are retracted to be positioned within a pivoting circle TC in the pivoting posture. The pivoting circle TC is a pivoting trajectory of a portion radially farthest from the pivoting axis AX0 (e.g., the outer peripheral end of the first base link 29 or the second base link 39), when the robot 3 pivots the first arm 17 and the second arm 19 around the pivoting axis AX0 in the retracted state. The first hand 21 is disposed in the direction along the first diameter direction D1 in the pivoting posture. The length of the first hand 21 in the elongated direction thereof (the first diameter direction D1) is substantially twice the radial distance between the pivoting axis AX0 and the outer peripheral end of the first base link 29 (substantially equal to a pivoting radius "r" of the pivoting circle TC). That is, the length of the first hand 21 is substantially equal to the diameter of the pivoting circle TC. Similarly, the second hand 23 is disposed in the direction along the second diameter direction D2 in the pivoting posture. The length of the second hand 23 in the elongated direction thereof (e.g., the second diameter direction D2) is substantially twice the radial distance between the pivoting axis AX0 and the outer peripheral end of the second base link 39 (e.g., substantially equal to the pivoting radius "r" of the pivoting circle TC). That is, the length of the second hand 23 is substantially equal to the diameter of the pivoting circle TC.

As for the first hand 21 and the second hand 23, a hand may indicate only the tip portion where the notch 37 or 47 is formed, and a link may indicate the base end portion that is rotatably connected to the first intermediate link 31 or the second intermediate link 41. However, in the present embodiment, the first hand 21 or the second hand 23 refers to the entire portion from the base end portion to the tip portion.

As illustrated in FIG. 2, the first base link 29 and the first intermediate link 31 are configured such that a distance L1 between the pivoting axis AX0 and the first rotation axis AX1 is substantially equal to a distance L2 between the first rotation axis AX1 and the second rotation axis AX2. In the pivoting posture, the first arm 17 is brought into a posture in which the distance L1 between the pivoting axis AX0 and the first rotation axis AX1, the distance L2 between the first rotation axis AX1 and the second rotation axis AX2, and a distance L3 between the second rotation axis AX2 and the pivoting axis AX0 are substantially equal to each other. That is, in this state, the pivoting axis AX0, the first rotation axis AX1, and the second rotation axis AX2 make up the vertices of a substantially equilateral triangle when viewed from above, and each of the crossing angles of the first base link 29, the first intermediate link 31, and the first hand 21 is approximately 60°.

The second base link 39 and the second intermediate link 41 are configured such that a distance L4 between the pivoting axis AX0 and the third rotation axis AX3 is substantially equal to a distance L5 between the third rotation axis AX3 and the fourth rotation axis AX4. In the pivoting posture, the second arm 19 is brought into a posture in which the distance L4 between the pivoting axis AX0 and the third rotation axis AX3, the distance L5 between the third rotation axis AX3 and the fourth rotation axis AX4, and a distance L6 between the fourth rotation axis AX4 and the pivoting axis AX0 are substantially equal to each other. That is, in this state, the pivoting axis AX0, the third rotation axis AX3, and the fourth rotation axis AX4 make up the vertices of a substantially equilateral triangle when viewed from above, and each of the crossing angles of the second base link 39, the second intermediate link 41, and the second hand 23 is approximately 60°.

In the descriptions herein, the "pivoting" refers to rotating the first arm 17 and the second arm 19 together around the pivoting axis AX0. The "pivoting" is distinguishable from the "rotation" that refers to the rotation of the first base link 29 around the pivoting axis AX0, the rotation of the first intermediate link 31 around the first rotation axis AX1, the rotation of the first hand 21 around the second rotation axis AX2, the rotation of the second base link 39 around the pivoting axis AX0, the rotation of the second intermediate link 41 around the third rotation axis AX3, and the rotation of the second hand 23 around the fourth rotation axis AX4, when the first arm 17 or the second arm 19 is extended/retracted.

As illustrated in FIGS. 2 and 4, the first arm 17 moves the first hand 21 along the first diameter direction D1 to transfer the workpiece W loaded on the first hand 21 along the first diameter direction D1. In the present embodiment, since the distance L1 between the pivoting axis AX0 and the first rotation axis AX1 is substantially equal to the distance L2 between the first rotation axis AX1 and the second rotation axis AX2 as described above, it is possible to move the first hand 21 straight along the first diameter direction D1 coincident with the elongated direction of the first hand 21 in the extension/retraction operation of the first arm 17, by adjusting a pulley ratio of the first arm 17 to an appropriate value. The distances L1 and L2 may be different from each other. In this case as well, by adjusting the pulley ratio of the first arm 17 to an appropriate value, the trajectory of the tip portion of the first hand 21 with the workpiece W loaded thereon may be made substantially linear along the first diameter direction D1, even though the trajectory of the base end portion of the first hand 21 does not coincide with the first diameter direction D1 (e.g., the trajectory of the base end portion has only to be parallel to the first diameter direction D1, and may be present at an offset position). The operation of "moving the first hand 21 along the first diameter direction D1" includes this case.

Here, the connection member 33 of the first arm 17 and the second hand 23 of the second arm 19 are positioned at the same height. Thus, when the first base link 29 is rotated in a state where the workpiece W is loaded on the second hand 23, for example, until the first base link 29, the first intermediate link 31, and the first hand 21 are aligned on the straight line along the first diameter direction D1, the connection member 33 and the workpiece W interfere with each other. Accordingly, as illustrated in FIG. 4, the rotation angle range of the first base link 29 is set such that when the first arm 17 is extended, the first base link 29 is rotated by only a marginal angle at which the connection member 33 and the workpiece W loaded on the second hand 23 do not interfere with each other (e.g., an angle difference θ1 from the first diameter direction D1). Hereinafter, the posture of the first arm 17 in this state (e.g., the posture of FIG. 4) may be referred to as an "extended posture." The reach of the first arm 17 in the extended posture is the maximum reach of the first arm 17.

As illustrated in FIGS. 2 and 5, the second arm 19 moves the second hand 23 along the second diameter direction D2 to transfer the workpiece W loaded on the second hand 23 along the second diameter direction D2. In the present embodiment, since the distance L4 between the pivoting axis AX0 and the third rotation axis AX3 is substantially equal to the distance L5 between the third rotation axis AX3 and the fourth rotation axis AX4 as described above, it is possible to move the second hand 23 straight along the second diameter direction D2 coincident with the elongated direction of the second hand 23 in the extension/retraction operation of the second arm 19, by adjusting a pulley ratio of the second arm 19 to an appropriate value. The distances L4 and L5 may be different from each other. In this case as well, by adjusting the pulley ratio of the second arm 19 to an appropriate value, the trajectory of the tip portion of the second hand 23 with the workpiece W loaded thereon may be made substantially linear along the second diameter direction D2, even though the trajectory of the base end portion of the second hand 23 does not coincide with the second diameter direction D2 (the trajectory of the base end portion has only to be parallel to the second diameter direction D2, and may be present at an offset position). The operation of "moving the second hand 23 along the second diameter direction D2" includes this case.

Here, each member that makes up the second arm 19 is positioned at a different height (a relatively lower position in this example) from the first hand 21 of the first arm 17. Thus, even when the second base link 39 is rotated in a state where the workpiece W is loaded on the first hand 21, for example, until the second base link 39, the second intermediate link 41, and the second hand 23 are aligned on the straight line along the second diameter direction D2, the second arm 19 and the workpiece W do not interfere with each other. Accordingly, while the second arm 19 may be extended as described above, the rotation angle range of the second base link 39 is set such that when the second arm 19 is extended, the second base link 39 is rotated by only a predetermined angle (e.g., an angle difference θ2 from the second diameter direction D2) as illustrated in FIG. 5, in order to make the reaches of the second arm 19 and the first arm 17 the same. For example, the angle θ2 is the same as the angle θ1. Hereinafter, the posture of the second arm 19 in this state (e.g., the posture of FIG. 5) may be referred to as the "extended posture." The reach of the second arm 19 in the extended posture is the maximum reach of the second arm 19.

3. Power Mechanism of Robot

Next, an example of a power mechanism of the robot 3 will be described with reference to FIG. 6. FIG. 6 is a conceptual view illustrating an example of a schematic configuration of the power mechanism of the robot 3. FIG. 6 appropriately omits the illustration of, for example, a seal member.

Figure 6:
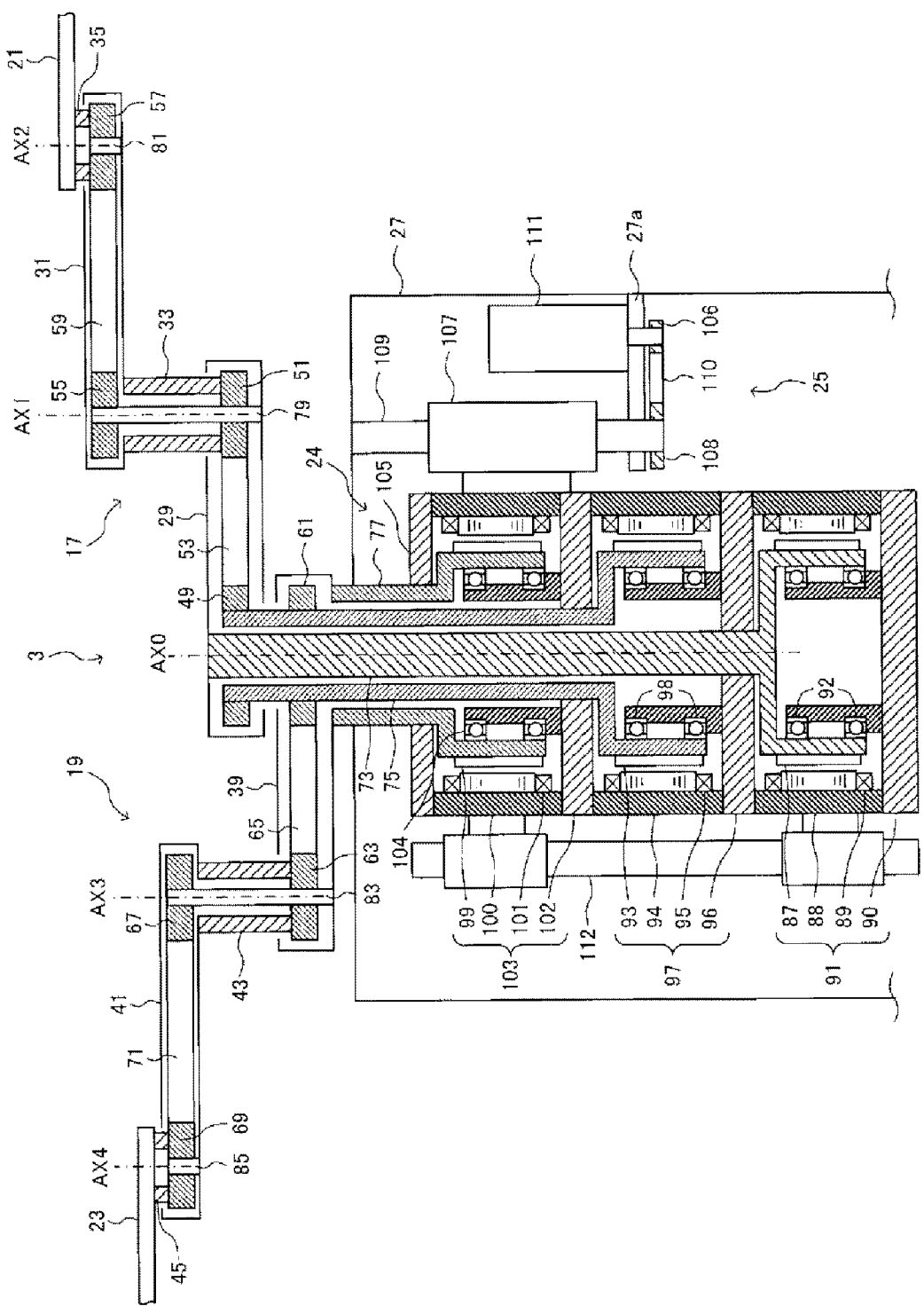
FIG. 6 is a conceptual view illustrating an example of a schematic configuration of a power mechanism of the robot.

As illustrated in FIG. 6, the first arm 17 includes pulleys 49 and 51 and a belt 53 that are disposed inside the first base link 29, and pulleys 55 and 57 and a belt 59 that are disposed inside the first intermediate link 31. The pulley 49 is disposed at the base end portion of the first base link 29, and the pulley 51 is disposed at the tip portion of the first base link 29. The belt 53 wraps around the pulleys 49 and 51. The pulley 55 is disposed at the base end portion of the first intermediate link 31, and the pulley 57 is disposed at the tip portion of the first intermediate link 31. The belt 59 wraps around the pulleys 55 and 57.

Similarly, the second arm 19 includes pulleys 61 and 63 and a belt 65 that are disposed inside the second base link 39, and pulleys 67 and 69 and a belt 71 that are disposed inside the second intermediate link 41. The pulley 61 is disposed at the base end portion of the second base link 39, and the pulley 63 is disposed at the tip portion of the second base link 39. The belt 65 wraps around the pulleys 61 and 63. The pulley 67 is disposed at the base end portion of the second intermediate link 41, and the pulley 69 is disposed at the tip portion of the second intermediate link 41. The belt 71 wraps around the pulleys 67 and 69.

The belts 53, 59, 65, and 71 may be made of a metal such as a steel plate, or may be made of rubber or resin. The belts 53, 59, 65, and 71 may be, for example, toothed belts, toothless flat belts or V-belts. The pulleys 49, 51, 55, 57, 61, 63, 67, and 69 may be, for example, toothed pulleys, toothless flat pulleys or V-pulleys.

The robot 3 includes a first pivoting shaft member 73, a second pivoting shaft member 75, and a third pivoting shaft member 77. The first pivoting shaft member 73 is a solid or hollow shaft member that is supported to be rotatable around the pivoting axis AX0. The second pivoting shaft member 75 is a hollow shaft member that is concentrically disposed outside the first pivoting shaft member 73 in the diameter direction thereof, and supported to be rotatable around the pivoting axis AX0. The third pivoting shaft member 77 is a hollow shaft member that is concentrically disposed outside the second pivoting shaft member 75 in the diameter direction thereof, and supported to be rotatable around the pivoting axis AX0. The first pivoting shaft member 73, the second pivoting shaft member 75, and the third pivoting shaft member 77 are connected to separate motors, respectively, and configured to be rotatable relative to each other.

The upper end of the first pivoting shaft member 73 is fixed to the base end portion of the first base link 29. The upper end of the third pivoting shaft member 77 is fixed to the base end portion of the second base link 39. The pulleys 49 and 61 are fixed to the upper end side of the second pivoting shaft member 75. The pulley 49 is disposed above the pulley 61.

A fixing shaft 79 is fixed to the bottom surface of the tip portion of the first base link 29. The pulley 51 is rotatably supported to the lower end side of the fixing shaft 79. The pulley 55 is fixed to the upper end side of the fixing shaft 79. The base end portion of the first intermediate link 31 is fixed to the pulley 51 via the connection member 33. A fixing shaft 81 is fixed to the bottom surface of the tip portion of the first intermediate link 31. The pulley 57 is rotatably supported on the fixing shaft 81. The base end portion of the first hand 21 is fixed to the pulley 57 via the connection member 35. The diameter of each of the pulleys 49, 51, 55, and 57 (e.g., a pulley diameter) is set to an appropriate ratio (e.g., a pulley ratio), such that the first hand 21 moves straight along the first diameter direction D1 coincident with the elongated direction as described above.

Similarly, a fixing shaft 83 is fixed to the bottom surface of the tip portion of the second base link 39. The pulley 63 is rotatably supported to the lower end side of the fixing shaft 83. The pulley 67 is fixed to the upper end side of the fixing shaft 83. The base end portion of the second intermediate link 41 is fixed to the pulley 63 via the connection member 43. A fixing shaft 85 is fixed to the bottom surface of the tip portion of the second intermediate link 41. The pulley 69 is rotatably supported on the fixing shaft 85. The base end portion of the second hand 23 is fixed to the pulley 69 via the connection member 45. The diameter of each of the pulleys 61, 63, 67, and 69 (e.g., a pulley diameter) is set to an appropriate ratio (e.g., a pulley ratio), such that the second hand 23 moves straight along the second diameter direction D2 coincident with the elongated direction as described above.

A magnet 87 is provided at the lower end of the first pivoting shaft member 73. A stator coil 89 is provided outside the magnet 87 in the diameter direction to face the magnet 87. The stator coil 89 is fixed to the inner peripheral surface of a cylindrical frame 88. A first bracket 90 is fixed to the counter load side of the frame 88 (e.g., the lower side in FIG. 6). The first bracket 90 supports a bearing 92 that rotatably supports the first pivoting shaft member 73. For example, the magnet 87, the stator coil 89, the frame 88, the first bracket 90, and the bearing 92 make up a first motor 91.

Similarly, a magnet 93 is provided at the lower end of the second pivoting shaft member 75. A stator coil 95 is provided outside the magnet 93 in the diameter direction to face the magnet 93. The stator coil 95 is fixed to the inner peripheral surface of a cylindrical frame 94. A second bracket 96 is fixed to the counter load side of the frame 94 (e.g., the lower side in FIG. 6). The second bracket 96 supports a bearing 98 that rotatably supports the second pivoting shaft member 75. For example, the magnet 93, the stator coil 95, the frame 94, the second bracket 96, and the bearing 98 make up a second motor 97.

Similarly, a magnet 99 is provided at the lower end of the third pivoting shaft member 77. A stator coil 101 is provided outside the magnet 99 in the diameter direction to face the magnet 99. The stator coil 101 is fixed to the inner peripheral surface of a cylindrical frame 100. A third bracket 102 is fixed to the counter load side of the frame 100 (the lower side in FIG. 6), and a load-side cover 105 is fixed to the load side of the frame 100 (the upper portion in FIG. 6). The third bracket 102 supports a bearing 104 that rotatably supports the third pivoting shaft member 77. For example, the magnet 99, the stator coil 101, the frame 100, the third bracket 102, and the bearing 104 make up a third motor 103.

The first motor 91, the second motor 97, and the third motor 103 are arranged inside the base 27 such that the third motor 103 is disposed at the upper end portion of the base 27, the first motor 91 is disposed at the lower end portion of the base 27, and the second motor 97 is disposed between the first motor 91 and the third motor 103.

When the first motor 91 is driven to rotate the first pivoting shaft member 73 around the pivoting axis AX0 in a stopped state of the second motor 97 where the second pivoting shaft member 75 is stationary, the first arm 17 is extended/retracted. When the third motor 103 is driven to rotate the third pivoting shaft member 77 around the pivoting axis AX0 in the stopped state of the second motor 97 where the second pivoting shaft member 75 is stationary, the second arm 19 is extended/retracted. When the first motor 91 and the third motor 103 are simultaneously driven to simultaneously rotate the first pivoting shaft member 73 and the third pivoting shaft member 77 around the pivoting axis AX0 in the stopped state of the second motor 97 where the second pivoting shaft member 75 is stationary, the first arm 17 and the second arm 19 are simultaneously extended/retracted.

When the first motor 91, the second motor 97, and the third motor 103 are simultaneously driven to rotate the first pivoting shaft member 73, the second pivoting shaft member 75, and the third pivoting shaft member 77 at the same rotation speed in the same rotation direction by the same angle, the first arm 17 and the second arm 19 are pivoted around the pivoting axis AX0 while maintaining the positional relationship thereof in the circumferential direction of the pivoting axis AX0, without performing the extension/retraction operation. This pivoting operation is performed after the first arm 17 and the second arm 19 are brought together into the pivoting posture as described above. The description "while maintaining the positional relationship thereof in the circumferential direction of the pivoting axis AX0" indicates maintaining the arrangement direction (e.g., angle) of each of the members 29, 31, and 21 of the first arm 17 with respect to the first diameter direction D1 and the arrangement direction (e.g., angle) of each of the members 39, 41, and 23 of the second arm 19 with respect to the second diameter direction D2 in the state of the pivoting posture illustrated in FIG. 2, while maintaining the angle difference $\theta$ between the movement direction of the first hand 21 (e.g., the first diameter direction D1) and the movement direction of the second hand 23 (e.g., the second diameter direction D2). For example, the first motor 91, the second motor 97, the third motor 103, the first pivoting shaft member 73, the second pivoting shaft member 75, and the third pivoting shaft member 77 make up the pivoting device 24.

The robot 3 includes the elevation device 25 that moves the first arm 17 and the second arm 19 together up and down in the axial direction of the pivoting axis AX0 (vertical direction) while maintaining the positional relationship thereof in the circumferential direction. As illustrated in FIG. 6, the elevation device 25 includes, for example, a slider 107, a transport screw 109, an elevation motor 111, and a linear guide 112. The elevation motor 111 is provided beside the motors 91, 97, and 103 inside the base 27, and is supported by a support member 27a. The transport screw 109 is supported by a bearing (not illustrated) to be rotatable with respect to the support member 27a and the upper end of the base 27. The motors 91, 97, and 103 are provided to be movable vertically in the base 27 by the linear guide 27. A pulley 106 is provided at an output shaft disposed below the elevation motor 111, and a pulley 108 is provided at the lower end of the transport screw 109. A belt 110 wraps round the pulleys 106 and 108. The elevation motor 111 rotates the transport screw 109 by the pulleys 106 and 108 and the belt 110. The slider 107 is connected to at least one of the motors 91, 97, and 103, and moves vertically by the rotation of the transport screw 109. In this way, the first arm 17 and the second arm 19 move up and down in the axial direction of the pivoting axis AX0 together with, for example, the first motor 91, the second motor 97, and the third motor 103, by the driving of the elevation motor 111. The installation position of the elevation device 25 is not limited to the portion beside the motors 91, 97, and 103, and for example, the elevation device 25 may be provided below the motors 91, 97, and 103. Further, the elevation device 25 may be provided outside the base 27.

Since the robot 3 is disposed in the transfer chamber 5 under the vacuum state, the internal space of each of the motors 91, 97, and 103 that communicates with the vacuum space becomes the vacuum state. Meanwhile, the external space of each of the motors 91, 97, and 103, that is, the internal space of the base 27 where the elevation device 25, the linear guide 112 and others are disposed becomes the atmospheric pressure state.

4. Functional Configuration of Robot Controller

Figure 7:
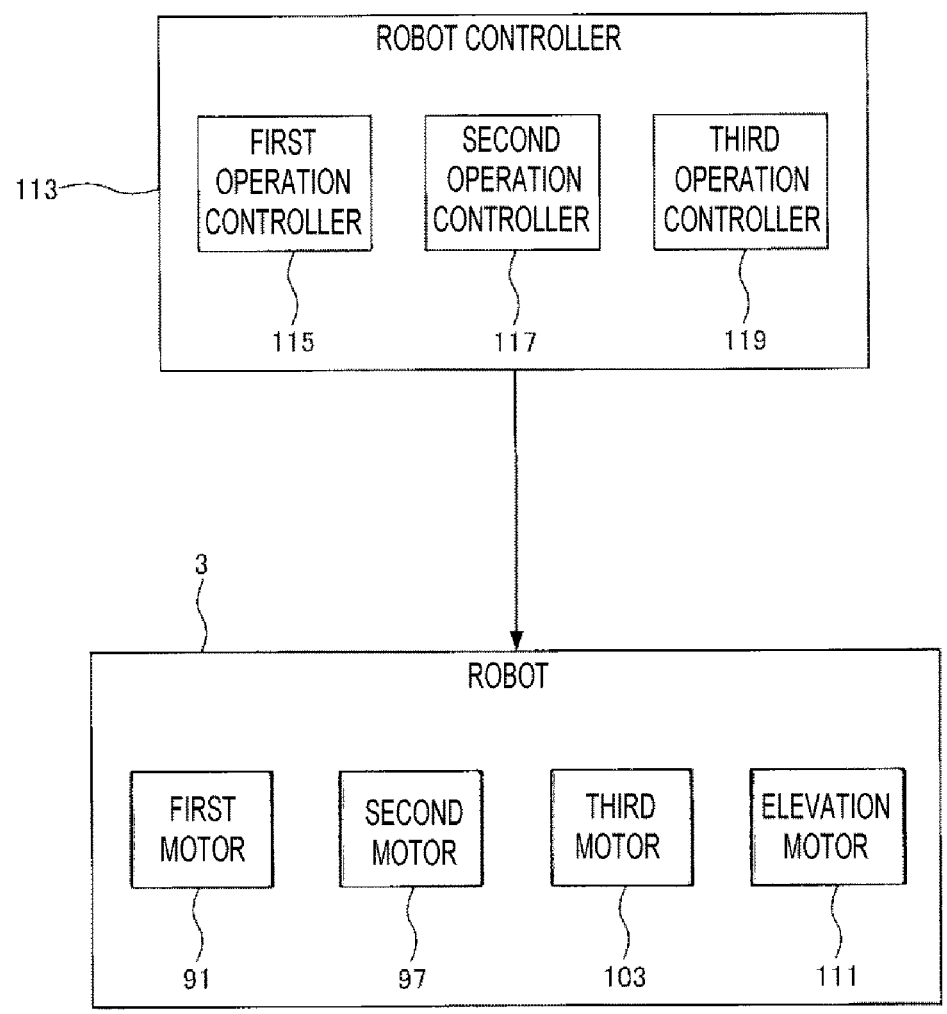
FIG. 7 is a block diagram illustrating an example of a functional configuration of a robot controller.

Next, an example of a functional configuration of the robot controller will be described with reference to FIG. 7. FIG. 7 is a block diagram illustrating an example of the functional configuration of the robot controller.

The robot system 1 includes the robot controller 113 that controls the robot 3. The robot controller 113 is configured by, for example, a motion controller, a personal computer (PC), a programmable logic controller (PLC) or a servo amplifier. The robot controller 113 includes a first operation controller 115, a second operation controller 117, and a third operation controller 119.

The first operation controller 115 controls the extension/retraction operation of the first arm 17. That is, the first operation controller 115 drives the first motor 91 in a state where the second motor 97 is stopped, thereby extending/retracting the first arm 17 and moving the first hand 21 along the first diameter direction D1.

The second operation controller 117 controls the pivoting operation and the elevation operation of the first arm 17 and the second arm 19. That is, the second operation controller 117 controls the pivoting device 24 and the elevation device 25 to move the first arm 17 and the second arm 19 up and down in the axial direction, simultaneously with pivoting the first arm 17 and the second arm 19 in the circumferential direction. When the first hand 21 and the second hand 23 enter/exit from an area in the same direction (e.g., the connection port 7a of the same processing chamber 7), the second operation controller 117 moves the first arm 17 and the second arm 19 up and down in the axial direction, simultaneously with pivoting the first arm 17 and the second arm 19 by the predetermined angle θ that is the angle difference between the first diameter direction D1 and the second diameter direction D2. Further, when the first hand 21 and the second hand 23 enter/exit from an area of the same height (e.g., the connection port 7a of the same processing chamber 7), the second operation controller 117 moves the first arm 17 and the second arm 17 up and down by the offset distance "d" between the first hand 21 and the second hand 23 in the axial direction, simultaneously with pivoting the first arm 17 and the second arm 19 by the angle difference θ between the first diameter direction D1 and the second diameter direction D2.

Specifically, the second operation controller 117 drives the first motor 91, the second motor 97, and the third motor 103 at the same time, to pivot the first arm 17 and the second arm 19 together in the circumferential direction by the predetermined angle θ while maintaining the positional relationship thereof in the circumferential direction of the pivoting axis AX0. Further, the second operation controller 117 drives the elevation motor 111 simultaneously with the pivoting operation, to move the first arm 17 and the second arm 19 up and down in the axial direction of the pivoting axis AX0 by the predetermined distance (e.g., the offset distance "d" between the first hand 21 and the second hand 23). The time required for the pivoting operation by the angle θ is set to be equal to or shorter than the time required for the elevation operation by the predetermined distance.

The third operation controller 119 controls the extension/retraction operation of the second arm 19. That is, the third operation controller 119 drives the third motor 103 in a state where the second motor 97 is stopped, thereby extending/retracting the second arm 19 and moving the second hand 23 along the second diameter direction D2.

The robot controller 113 also controls the operations of the robot 3 other than the operations described above. For example, the robot controller 113 separately performs the pivoting operation and the elevation operation of the first arm 17 and the second arm 19. For example, the robot controller 113 performs an operation of moving the first hand 21 and the second hand 23 up and down by a predetermined distance, in order to lift or place the workpiece W from or on the processing shelf 7b of the processing chamber 7 (see, e.g., FIG. 9 to be described later) or the support shelf of the workpiece cassette 15. In the elevation operation by the second operation controller 117, the predetermined distance for lifting or placing the workpiece W may be added or deducted with respect to the offset distance "d" between the first hand 21 and the second hand 23. Further, when the first hand 21 and the second hand 23 enter/exit from areas of different heights (e.g., different support shelves in the workpiece cassette 15), the distance that corresponds to the difference between the different heights may be added or deducted with respect to the offset distance "d," in elevation operation by the second operation controller 117.

The robot controller 113 may be configured by a single control device or a plurality of control devices. When the robot controller 113 is configured by a plurality of control devices, for example, a host controller that outputs a position instruction and a servo amplifier that supplies a power to each of the motors 91, 97, 103, and 111 may be provided separately.

The distribution of the processes and others performed in, for example, the first operation controller 115, the second operation controller 117, and the third operation controller 119 is not limited to the example described above. For example, the processes and others may be performed by a relatively fewer number of process units (e.g., one processing unit) or may be performed by further subdivided process units. Further, among the process units of the robot controller 113, only a portion that supplies a driving power to each of the motors 91, 97, 103, and 111 (e.g., the servo amplifier) may be mounted by an actual device, and the other functions may be mounted by a program executable by a CPU 901 to be described later (see FIG. 18). Further, a portion or all of the process units of the robot controller 113 may be mounted by actual devices such as an ASIC, an FPGA or other electric circuits.

5. Control Contents of Robot Controller and Operation of Robot

Figure 8:
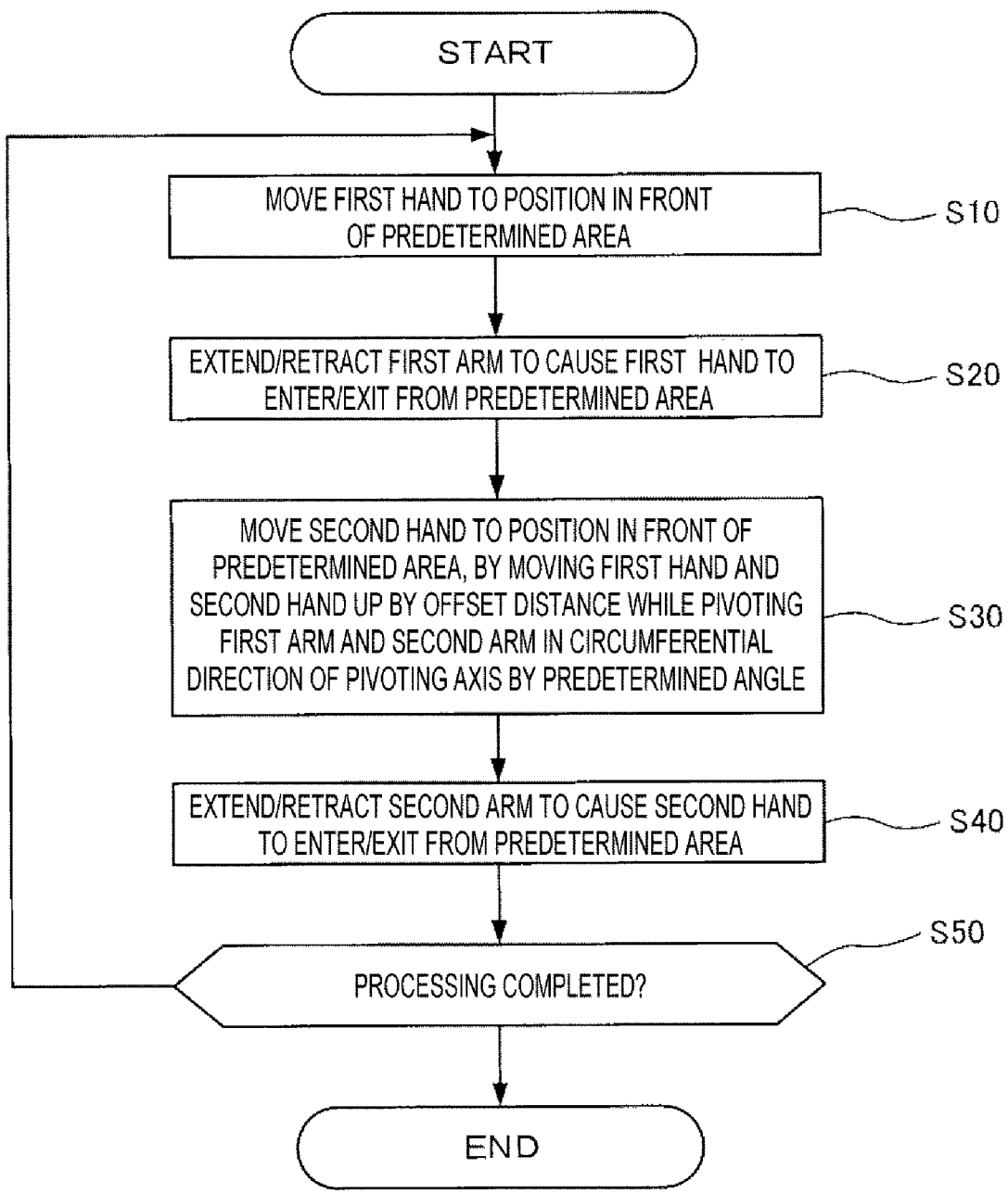
FIG. 8 is a flowchart illustrating an example of control contents executed by the robot controller.

Next, descriptions will be made on an example of control contents executed by the robot controller 113 and an example of the operation of the robot 3, when the workpiece W is carried into the processing chamber 7, with reference to FIGS. 8 to 15. FIG. 8 is a flowchart illustrating an example of the control contents executed by the robot controller 113. FIGS. 9 to 15 are explanatory views illustrating an example of the operation of the robot 3.

As illustrated in FIG. 8, in step S10, the robot controller 113 pivots the first arm 17 and the second arm 19 around the pivoting axis AX0 and moves the first arm 17 and the second arm 19 up by the elevation device 25, thereby moving the first hand 21 to a position in front of a predetermined area. The "predetermined area" refers to, for example, the connection port 5*a* connected to the connection port 7*a* of a predetermined processing chamber 7. The "predetermined area" may be, for example, a specific support shelf of the workpiece cassette 15.

Figure 9:
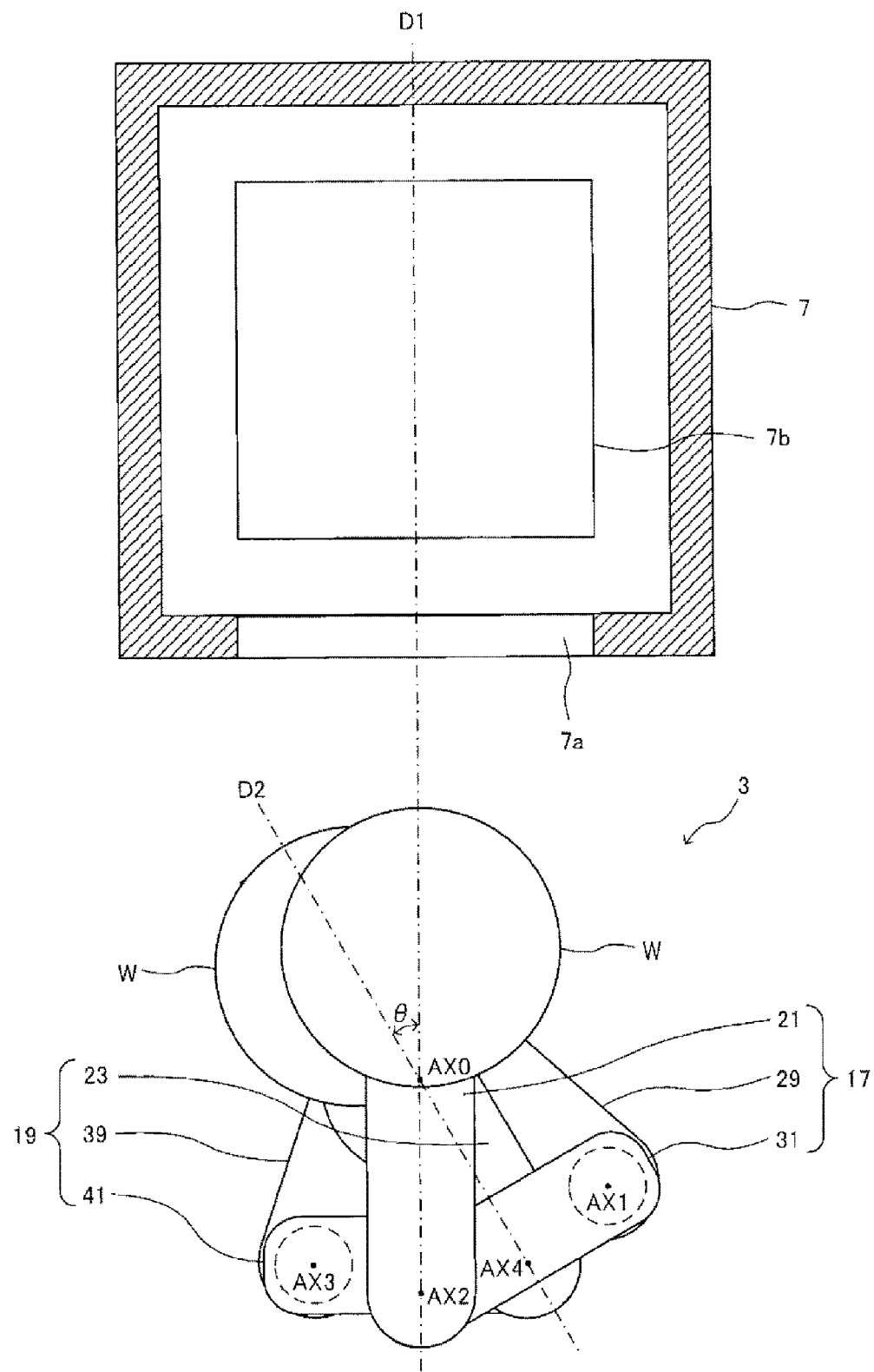
FIG. 9 is an explanatory view illustrating an example of an operation of the robot.

FIG. 9 illustrates an example of the operation of the robot 3 in step S10. FIG. 9 omits the illustration of the transfer chamber 5 or the connection port 5*a* (the same applies to FIGS. 10 to 15). In the example illustrated in FIG. 9, the robot 3 brings both the first arm 21 and the second hand 23 into the pivoting posture, in a state where the workpieces W are loaded on the first hand 21 and the second hand 23, respectively. Then, the robot 3 pivots and moves the first arm 17 and the second arm 19 up, to move the first hand 21 to the position in front of the connection port 7*a* of the processing chamber 7. That is, the robot 3 pivots the first arm 17 and the second arm 19 such that the connection port 7*a* of the processing chamber 7 is positioned on the first diameter direction D1, and moves the first arm 17 and the second arm 19 up such that the height position of the first hand 21 is substantially equal to the height position of the connection port 7*a* of the processing chamber 7.

Referring back to FIG. 8, in step S20, the robot controller 113 extends/retracts the first arm 17 by the first operation controller 115, to cause the first hand 21 to enter/exit from the predetermined area. Specifically, the robot controller 113 extends the first arm 17 such that the first hand 21 with the workpiece W loaded thereon enters the processing chamber 7 through the connection ports 5*a* and 7*a*, and places the workpiece W on the processing shelf 7*b*. Then, the robot controller 113 retracts the first arm 17 such that the first hand 21 from which the workpiece W has been unloaded retreats from the processing chamber 7, and the first arm 17 returns to the pivoting posture.

Figure 10:
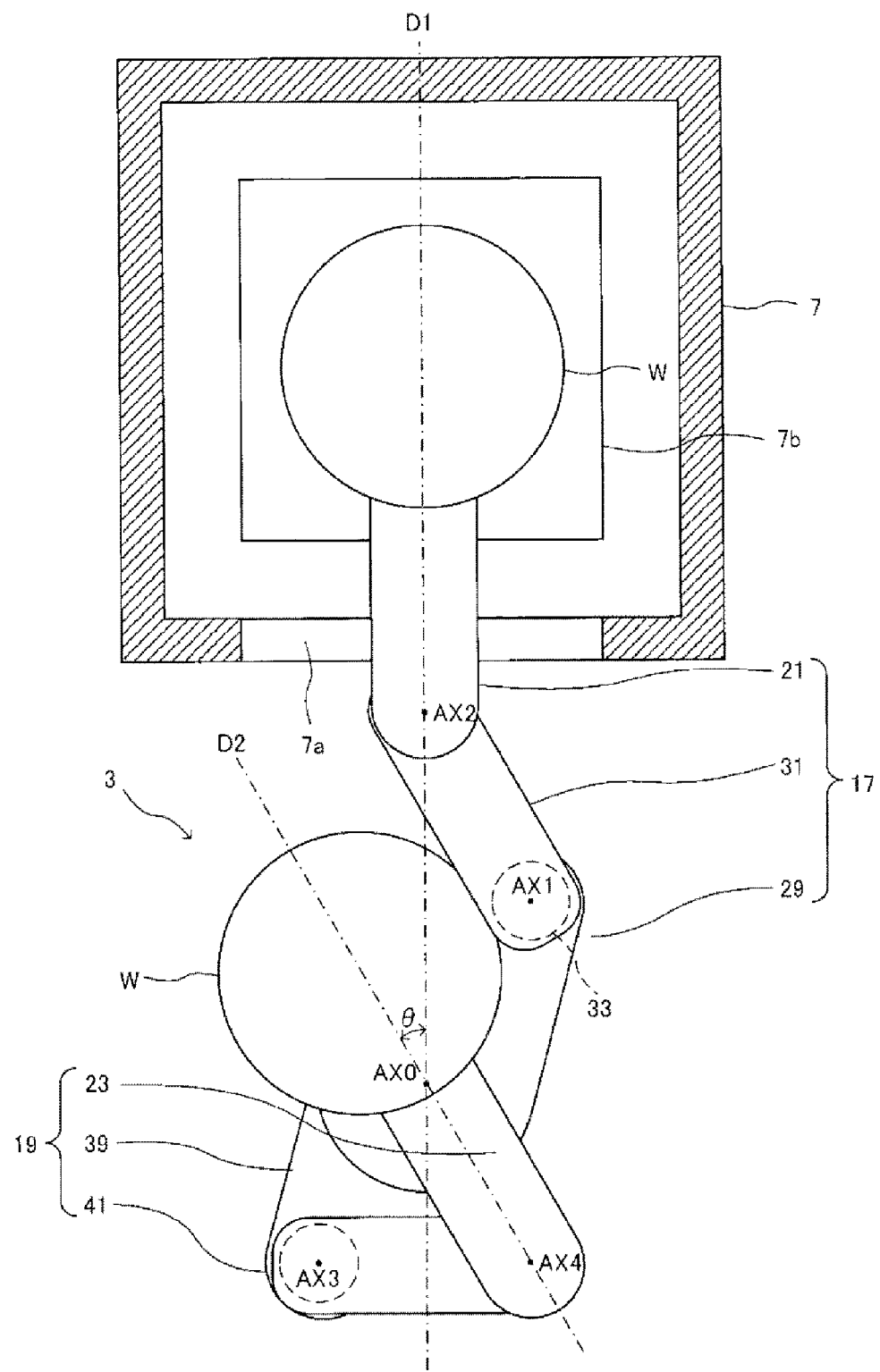
FIG. 10 is an explanatory view illustrating an example of the operation of the robot.
Figure 11:
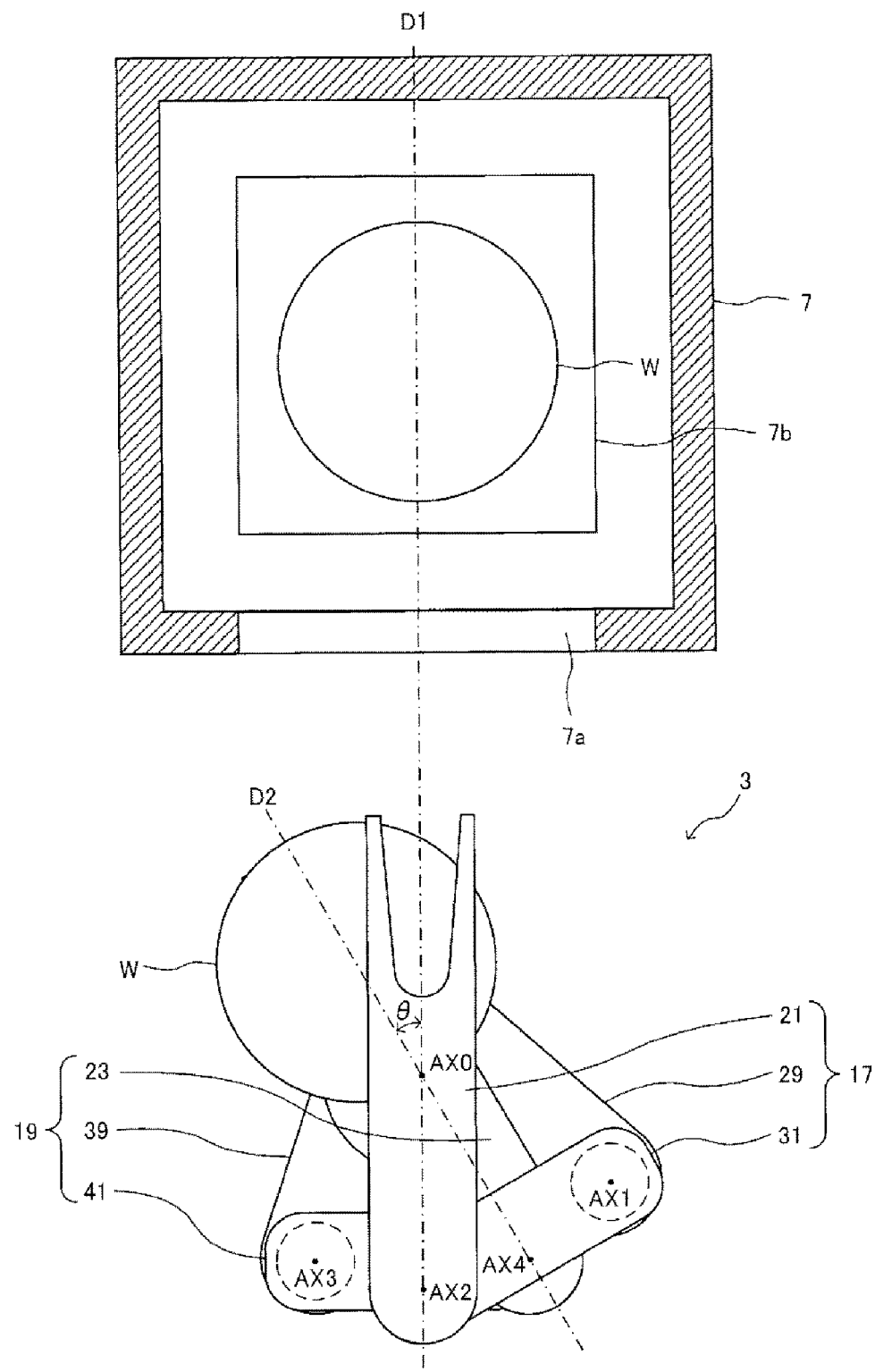
FIG. 11 is an explanatory view illustrating an example of the operation of the robot.

FIGS. 10 and 11 illustrate an example of the operation of the robot 3 in step S20. As illustrated in FIG. 10, the robot 3 extends the first arm 17, for example, until the first arm 17 has the extended posture as described above, such that the first hand 21 with the workpiece W loaded thereon moves along the first diameter direction D1, enters the processing chamber 7 through the connection port 7*a*, and places the workpiece W on the processing shelf 7*b*. Then, as illustrated in FIG. 11, the robot 3 retracts the first hand 21 such that the first hand 21 from which the workpiece W has been unloaded retreats from the processing chamber 7 along the first diameter direction D1, and the first arm 17 returns to the pivoting posture.

Referring back to FIG. 8, in step S30, the robot controller 113 moves the first arm 17 and the second arm 19 up in the axial direction, simultaneously with pivoting the first arm 17 and the second arm 19 in the circumferential direction, by the second operation controller 117. Specifically, the robot controller 113 pivots the first arm 17 and the second arm 19 around the pivoting axis AX0 by the predetermined angle θ that is the angle difference between the first diameter direction D1 and the second diameter direction D2, and simultaneously, moves the first arm 17 and the second arm 19 up along the axial direction of the pivoting axis AX0 by the offset distance "d" between the first hand 21 and the second hand 23, so as to move the second hand 23 to the position in front of the predetermined area (e.g., the connection port 5*a* connected to the connection port 7*a* of the predetermined processing chamber 7, in this example). That is, the robot controller 113 pivots the first arm 17 and the second arm 19 such that the connection port 7*a* of the processing chamber 7 is positioned on the second diameter direction D2, and moves the first arm 17 and the second arm 19 up by the offset distance "d" such that the height position of the second hand 23 is substantially equal to the height position of the connection port 7*a* of the processing chamber 7.

Figure 12:
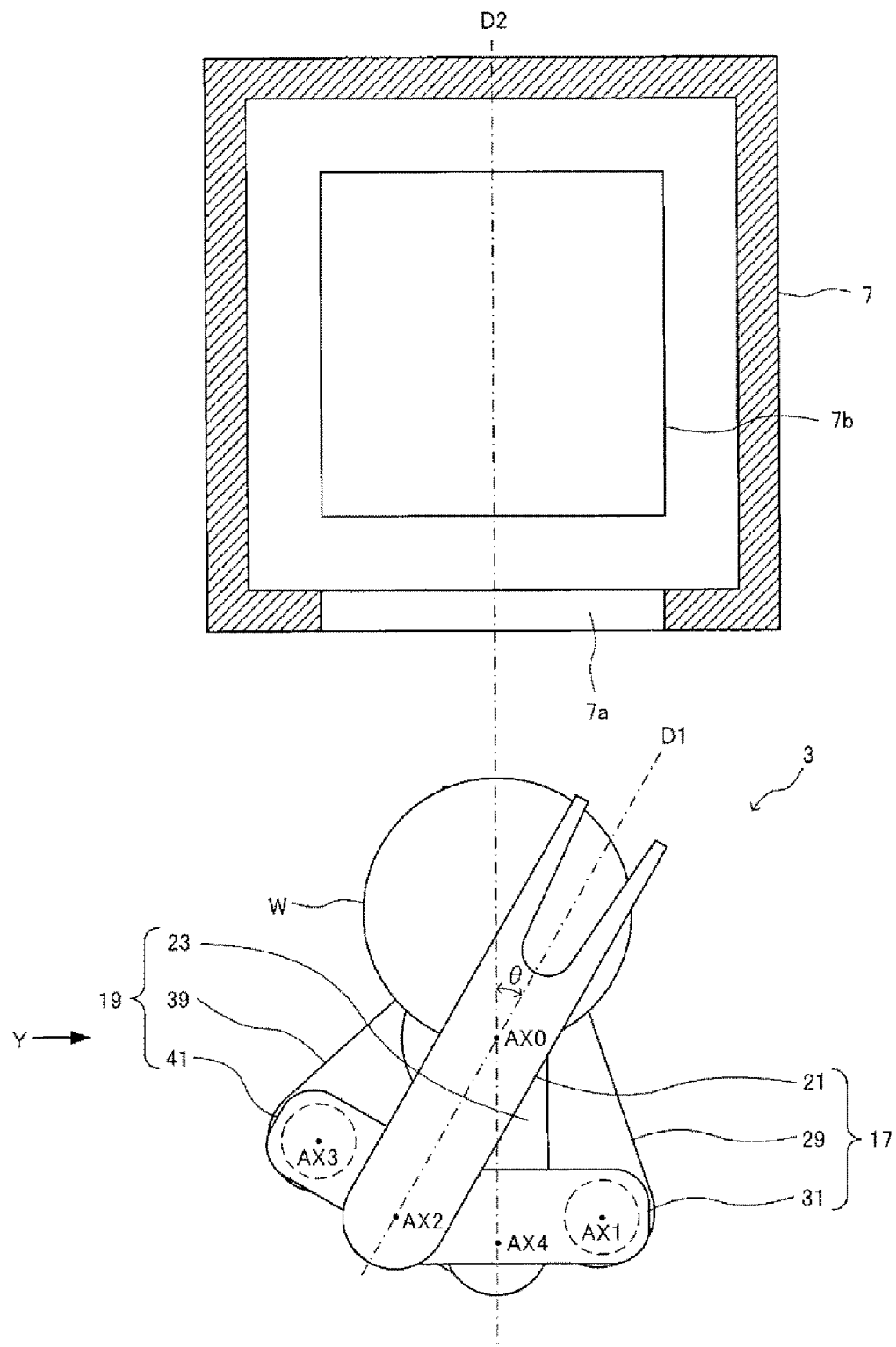
FIG. 12 is an explanatory view illustrating an example of the operation of the robot.
Figure 13:
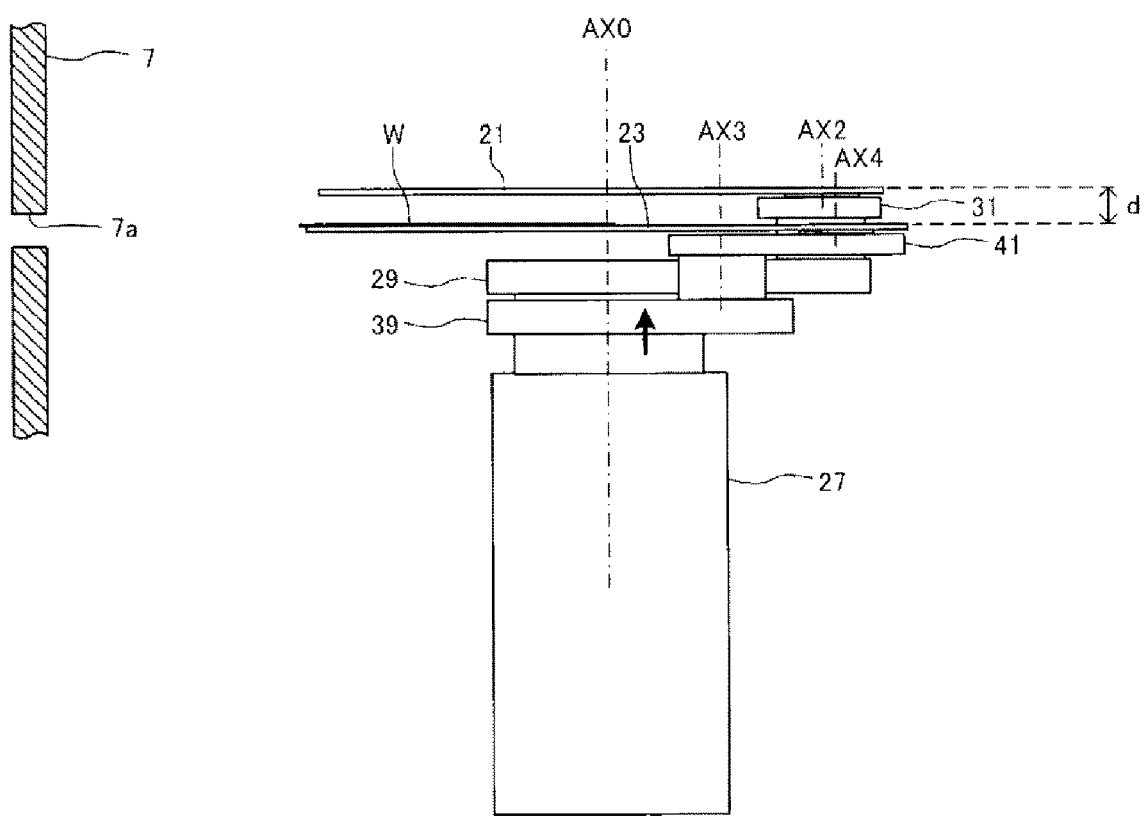
FIG. 13 is an explanatory view illustrating an example of the operation of the robot.

FIGS. 12 and 13 illustrate an example of the operation of the robot 3 in step S30. In FIG. 12, for example, the processing shelf 7*b* of the processing chamber 7 is replaced with a processing shelf 7*b* on which no workpiece W is placed. FIG. 13 is a side view when viewed from the direction of the arrow Y in FIG. 12. As illustrated in FIG. 12, the robot 3 pivots and moves the first arm 17 and the second arm 19 up, to move the second hand 23 to the position in front of the connection port 7*a* of the processing chamber 7. That is, as illustrated in FIG. 12, the robot 3 pivots the first arm 17 and the second arm 19 such that the connection port 7*a* of the processing chamber 7 is positioned on the second diameter direction D2, and simultaneously, moves the first arm 17 and the second arm 19 up by the offset distance "d" such that the height position of the second hand 23 is substantially equal to the height position of the connection port 7*a* of the processing chamber 7.

In the elevation operation of step S30, the predetermined distance for lifting or placing the workpiece W from or on the processing shelf 7*b* may be added or deducted with respect to the offset distance "d." Further, for example, when the first hand 21 and the second hand 23 enter/exit from areas of different heights (e.g., connection ports of different heights in the same processing chamber 7), the distance that corresponds to the difference between the different heights may be added or deducted with respect to the offset distance "d" in the elevation operation of step S30.

Referring back to FIG. 8, in step S40, the robot controller 113 extends/retracts the second arm 19 by the third operation controller 119, to cause the second hand 23 to enter/exit from the predetermined area. Specifically, the robot controller 113 extends the second arm 19 such that the second hand 23 with the workpiece W loaded thereon enters the processing chamber 7 through the connection ports 5*a* and 7*a*, and places the workpiece W on the processing shelf 7*b*. Then, the robot controller 113 retracts the second arm 19 such that the second hand 23 from which the workpiece W has been unloaded retreats from the processing chamber 7, and the second arm 19 returns to the pivoting posture.

Figure 14:
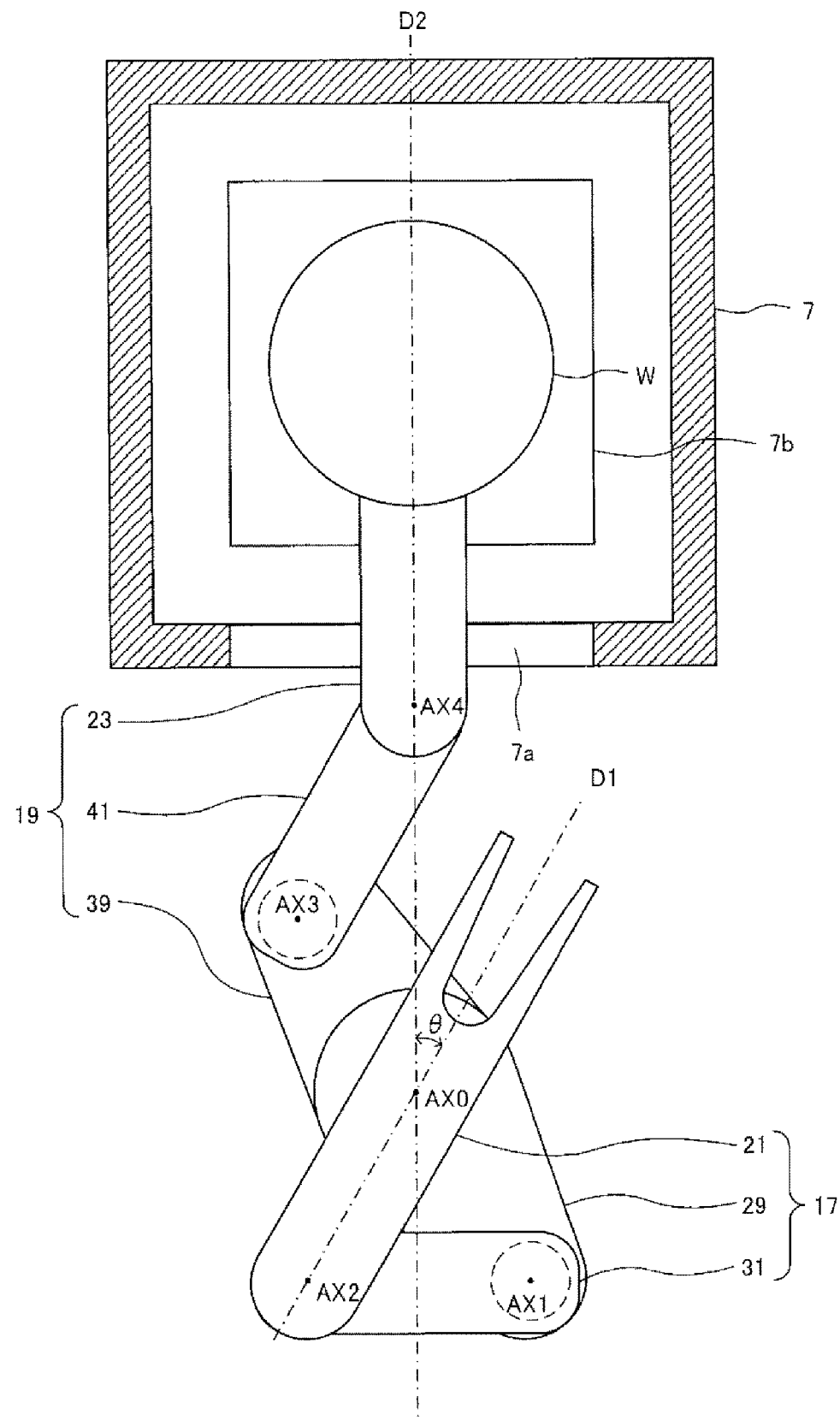
FIG. 14 is an explanatory view illustrating an example of the operation of the robot.
Figure 15:
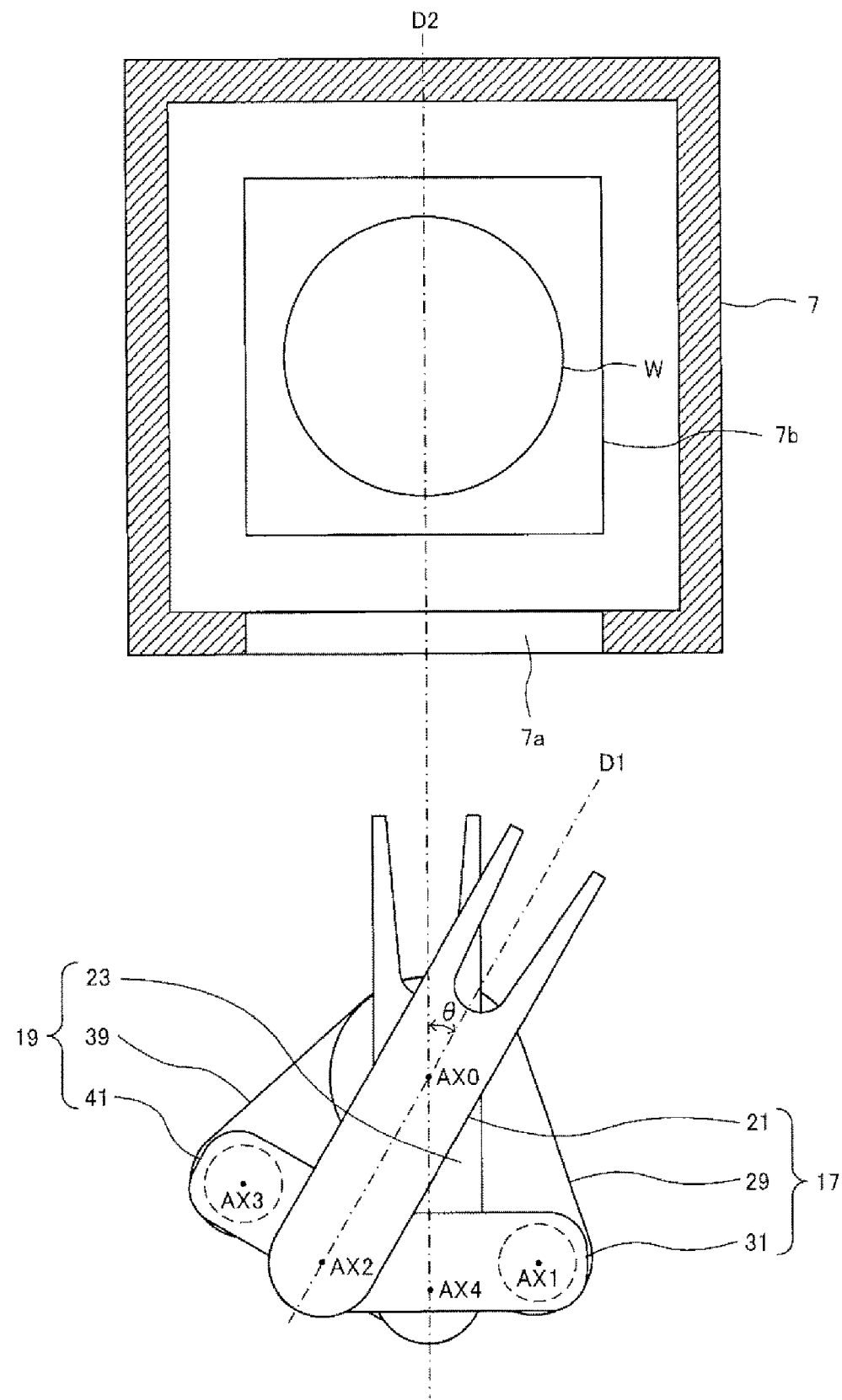
FIG. 15 is an explanatory view illustrating an example of the operation of the robot.

FIGS. 14 and 15 illustrate an example of the operation of the robot 3 in step S40. As illustrated in FIG. 14, the robot 3 extends the second arm 19, for example, until the second arm 19 has the extended posture as described above, such that the second hand 23 with the workpiece W loaded thereon moves along the second diameter direction D2, enters the processing chamber 7 through the connection port 7*a*, and places the workpiece W on the processing shelf 7*b*. Then, as illustrated in FIG. 15, the robot 3 retracts the second arm 19 such that the second hand 23 from which the workpiece W has been unloaded retreats from the processing chamber 7 along the second diameter direction D2, and the second arm 19 returns to the pivoting posture.

Referring back to FIG. 8, in step S50, the robot controller 113 determines whether the continuous processing that is executed on the workpieces W in the robot system 1 has been completed. When it is determined that the processing has not been completed (step S50: NO), the process returns to previous step S10. When it is determined that the processing has been completed (step S50: YES), the flow ends.

While descriptions have been made on an example of the control contents and the operations performed when the workpiece W is carried into the processing chamber 7, the control contents and the operations are identically applied to a case where the workpiece W is carried into the cassette chamber 9 (e.g., the workpiece cassette 15) or other areas. Further, the control contents and the operations are identically applied to a case where the workpiece W is carried out from the processing chamber 7 or other areas.

6. Effects of Embodiment

As described above, the robot system 1 of the present embodiment includes the robot 3 and the robot controller 113 that controls the robot 3. The robot 3 includes the first arm 17 that is a horizontal multi-joint type arm provided with the first base link 29 provided to be rotatable around the pivoting axis AX0, the first intermediate link 31 connected to the tip portion of the first base link 29 to be rotatable around the first rotation axis AX1, and the first hand 21 connected to the tip portion of the first intermediate link 31 to be rotatable around the second rotation axis AX2 and formed to be longer in the elongated direction of the first hand 21 than each of the first base link 29 and the first intermediate link 31 thereby holding the workpiece W thereon, and configured to move the first hand 21 along the first diameter direction D1 centered on the pivoting axis AX0, the second arm 19 that is a horizontal multi-joint type arm provided with the second base link 39 provided to be independently rotatable from the first base link 29 around the pivoting axis AX0, the second intermediate link 41 connected to the tip portion of the second base link 39 to be rotatable around the third rotation axis AX3, and the second hand 23 connected to the tip portion of the second intermediate link 41 to be rotatable around the fourth rotation axis AX4 and formed to be longer in the elongated direction of the second hand 23 than each of the second base link 39 and the second intermediate link 41 thereby holding the workpiece W thereon, and configured to move the second hand 23 along the second diameter direction D2 having the preset angle θ in the circumferential direction of the pivoting axis AX0 with respect to the first diameter direction D1, and the pivoting device 24 configured to pivot the first arm 17 and the second arm 19 together in the circumferential direction while maintaining the positional relationship of the first arm 17 and the second arm 19 in the circumferential direction.

Figure 16:
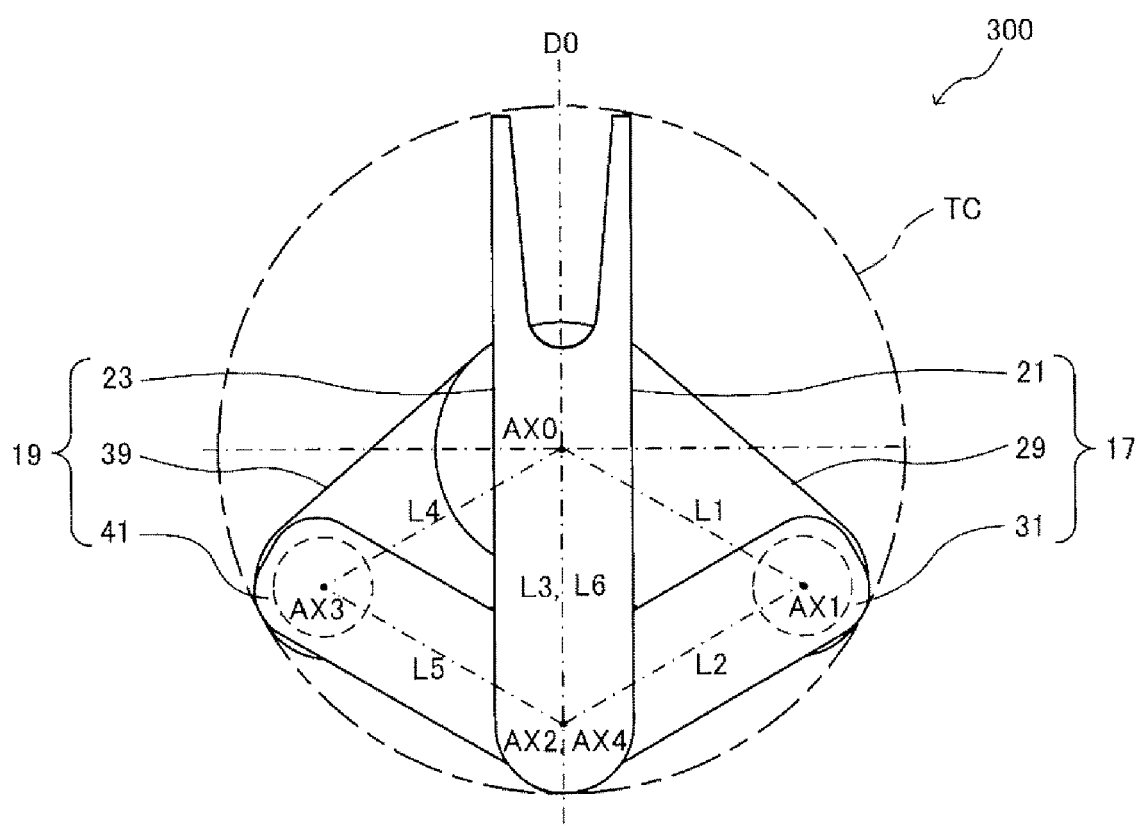
FIG. 16 is a top view illustrating an example of a state where a robot of a comparative example retracts a first arm and a second arm.
Figure 17:
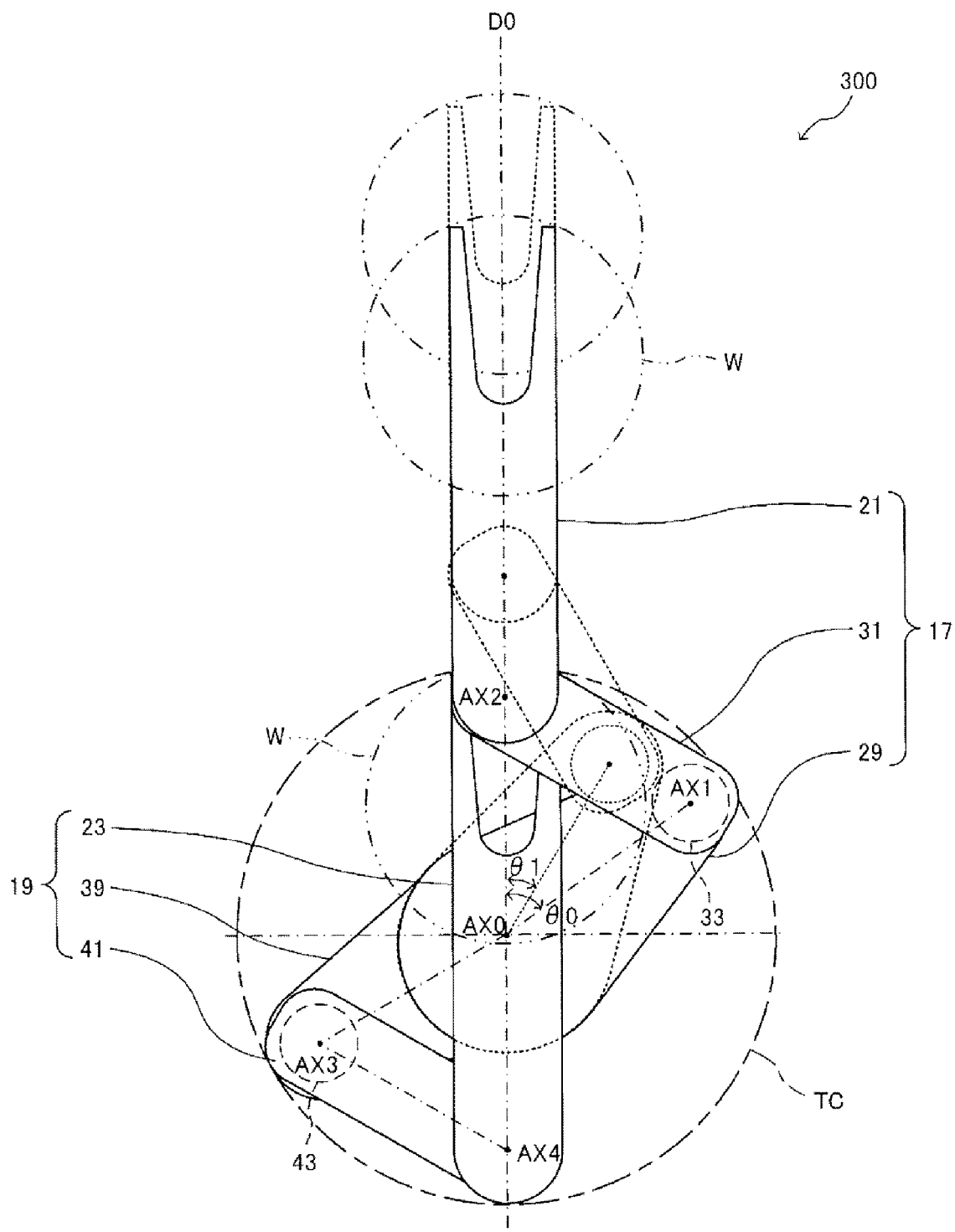
FIG. 17 is a top view illustrating an example of a state where the robot of the comparative example extends the first arm.

The effects of the present embodiment will be described, using a comparative example. FIGS. 16 and 17 illustrate an example of a structure of a robot 300 according to a comparative example. FIG. 16 is a top view illustrating an example of a state where the robot 300 retracts the first arm 17 and the second arm 19, and FIG. 17 is a top view illustrating an example of a state where the robot 300 extends the first arm 17. In FIGS. 16 and 17, the similar components to those of the robot 3 according to the present embodiment will be denoted by the same reference numerals as used in the present embodiment, and descriptions thereof will be omitted.

The robot 300 of the comparative example is different from the robot 3 of the present embodiment in that the movement direction of the first hand 21 by the first arm 17 and the movement direction of the second hand 23 by the second arm 19 are the same diameter direction (e.g., a diameter direction D0). Thus, as illustrated in FIG. 16, when the first arm 17 and the second arm 19 are brought into the pivoting posture, the substantially entire portion of the first hand 21 and the substantially entire portion of the second hand 23 overlap with each other in the axial direction of the pivoting axis AX0 (e.g., a vertical direction). As illustrated in FIG. 17, the first arm 17 moves the first hand 21 along diameter direction D0, to transfer the workpiece W loaded on the first hand 21 along the diameter direction D0. In the extension/retraction operation of the first arm 17, the first hand 21 moves straight along the diameter direction D0 that coincides with the elongated direction. Similarly, although not illustrated, the second arm 19 moves the second hand 23 along the diameter direction D0, to transfer the workpiece W loaded on the second hand 23 along the diameter direction D0. In the extension/retraction operation of the second arm 19, the second hand 23 moves straight along the diameter direction D0 that coincides with the elongated direction. The other configurations of the robot 300 of the comparative example are substantially similar to those of the robot 3 of the resent embodiment, except that the movement directions of the first hand 21 and the second hand 23 are the same.

In the robot 300 as well, when the first arm 17 is extended by a predetermined amount or more in a state where the workpiece W is loaded on the second hand 23, the connection member 33 and the workpiece W interfere with each other, as in the robot 3 of the present embodiment. Accordingly, as illustrated in FIG. 17, the rotation angle range of the first base link 29 is set such that when the first arm 17 is extended, the first base link 29 is rotated by only a marginal angle at which the connection member 33 and the workpiece W loaded on the second hand 23 do not interfere with each other (e.g., an angle difference θ0 from the diameter direction D0). Since the directions of the first hand 21 and the second hand 23 of the robot 300 are the same, the angle difference θ0 is larger than the angle difference θ1 in the present embodiment, and the angle range in which the first base link 29 is rotatable is reduced. As a result, the reach of each of the arms 17 and 19 is limited.

In the present embodiment, the movement direction of the first hand 21 by the first arm 17 (the first diameter direction D1) and the movement direction of the second hand 23 by the second arm 19 (the second diameter direction D2) are different from each other by the predetermined angle θ, so that it becomes easy to avoid or suppress the interference between the first arm 17 and the workpiece W held by the second arm 19 when the first arm 17 is extended. That is, the angle difference θ1 is smaller than the angle difference θ0, and the angle range in which the first base link 29 is rotatable may be widened. As a result, the reach of the first arm 17 may be increased. For the comparison of reaches, FIG. 17 represents the extended posture of the first arm 17 of the robot 3 according to the present embodiment by a dotted line. It is possible to reduce the pivoting radius "r" of the arms 17 and 19 as much as possible while ensuring the reach of each of the arms 17 and 19 as long as possible. That is, it is possible to achieve both the maximum reach and the minimum pivoting radius.

In the present embodiment, especially, the robot system 1 further includes the elevation device 25 that moves the first arm 17 and the second arm 19 together up and down in the axial direction of the pivoting axis AX0 while maintaining the positional relationship thereof in the circumferential direction. The robot controller 113 controls the pivoting device 24 and the elevation device 25 to move the first arm 17 and the second arm 19 up and down in the axial direction, simultaneously with pivoting the first arm 17 and the second arm 19 in the circumferential direction.

As a result, the tact time may be reduced, as compared with a case where the pivoting operation and the elevation operation of the first arm 17 and the second arm 19 are separately performed.

In the present embodiment, especially, the robot controller 113 includes the first operation controller 115 that extends/retracts the first arm 17 to move the first hand 21 along the first diameter direction D1, the second operation controller 117 that controls the pivoting device 24 and the elevation device 25 to move the first arm 17 and the second arm 19 up and down in the axial direction, simultaneously with pivoting the first arm 17 and the second arm 19 in the circumferential direction, and the third operation controller 119 that extends/retracts the second arm 19 to move the second hand 23 along the second diameter direction D2.

As a result, the tact time may be reduced, and the first hand 21 and the second hand 23 may enter/exit from the same area.

In the present embodiment, especially, the second operation controller 117 controls the pivoting device 24 and the elevation device 25 to move the first arm 17 and the second arm 19 up and down in the axial direction, simultaneously with pivoting the first arm 17 and the second arm 19 by the predetermined angle θ that is the angle difference between the first diameter direction D1 and the second diameter direction D2.

In the present embodiment, since the movement direction of the first hand 21 by the first arm 17 (e.g., the first diameter direction D1) and the movement direction of the second hand 23 by the second arm 19 (e.g., the second diameter direction D2) are different from each other by the predetermined angle θ, it is necessary to pivot the first arm 17 and the second arm 19 by the predetermined angle θ in order to cause the first hand 21 and the second hand 23 to enter/exit from the same area. Meanwhile, when the robot 3 transfers the workpiece W, for example, when the robot 3 lifts the workpiece W from a predetermined area or places the workpiece W on the area, the elevation operation of the first arm 17 and the second arm 19 (e.g., the first hand 21 and the second hand 23) is performed. In the present embodiment, the pivoting operation is performed simultaneously with the elevation operation, so that the increase in tact time may be prevented.

In the present embodiment, especially, the first hand 21 and the second hand 23 are arranged to be offset from each other in the axial direction, and the second operation controller 117 controls the pivoting device 24 and the elevation device 25 to move the first arm 17 and the second arm 19 up and down by the offset distance, simultaneously with pivoting the first arm 17 and the second arm 19 in the circumferential direction.

In the present embodiment, since the movement direction of the first hand 21 by the first arm 17 (e.g., the first diameter direction D1) and the movement direction of the second hand 23 by the second arm 19 (e.g., the second diameter direction D2) are different from each other by the predetermined angle θ, it is necessary to pivot the first arm 17 and the second arm 19 by the predetermined angle θ in order to cause the first hand 21 and the second hand 23 to enter/exit from the same area. Meanwhile, since the first hand 21 and the second hand 23 are arranged to be offset from each other in the axial direction, it is necessary to move the first arm 17 and the second hand 23 up and down by the offset distance in order to cause the first hand 21 and the second hand 23 to enter/exit from the same area. In the present embodiment, the pivoting operation is performed simultaneously with the elevation operation (e.g., the predetermined angle θ is set to the angle difference that corresponds to the range in which the first and second arms are pivotable during the elevation), so that the increase in tack time may be prevented.

In the present embodiment, especially, when the first arm 17 and the second arm 19 are pivoted by the pivoting device 24, the robot controller 113 brings the first arm 17 and the second arm 19 into the pivoting posture where the second rotation axis AX2 of the first hand 21 is positioned opposite to the tip of the first hand 21 with respect to the pivoting axis AX0, and the fourth rotation axis AX4 of the second hand 23 is positioned opposite to the tip of the second hand 23 with respect to the pivoting axis AX0.

As a result, it is possible to reduce the radius of the pivoting posture (e.g., the pivoting radius "r") when the first arm 17 and the second arm 19 are pivoted together.

In the present embodiment, especially, in the pivoting posture, the robot controller 113 causes the second rotation axis AX2 to be positioned between the third rotation axis AX3 and the fourth rotation axis AX4 in the circumferential direction, and causes the fourth rotation axis AX4 to be positioned between the first rotation axis AX1 and the second rotation axis AX2 in the circumferential direction.

In the present embodiment, when the first arm 17 and the second arm 19 are retracted into the pivoting posture, the first arm 17 and the second arm 19 at least partially overlap with each other in the axial direction. As a result, the pivoting radius "r" may be reduced, as compared with, for example, a case where the first arm 17 and the second arm 19 are arranged in parallel with each other in the plane direction perpendicular to the axial direction.

In the present embodiment, especially, in the pivoting posture, the robot controller 113 causes the first hand 21 to be positioned in the direction along the first diameter direction D1, and causes the second hand 23 to be positioned in the direction along the second diameter direction D2.

In the present embodiment, the first hand 21 and the second hand 23 are arranged in the different directions in a state where the first arm 17 and the second arm 19 are retracted into the pivoting posture. As a result, when one arm (e.g., the second arm 19) holds the workpiece W in a state of being retracted, and the other arm (e.g., the first arm 17) is extended, the interference between the extended arm and the workpiece W may be more easily avoided because the direction of the hand of the one arm (e.g., the second hand 23) and the extension direction of the other arm (e.g., the first arm 17) are different from each other. Further, since the first hand 21 and the second hand 23 at least partially overlap with each other in the axial direction in the pivoting posture, the pivoting radius "r" may be further reduced, as compared with a case where the first hand 21 and the second hand 23 are arranged in parallel with each other in the plane direction perpendicular to the axial direction.

In the present embodiment, especially, the first arm 17 is configured such that the distance L1 between the pivoting axis AX0 and the first rotation axis AX1 is substantially equal to the distance L2 between the first rotation axis AX1 and the second rotation axis AX2, and the second arm 19 is configured such that the distance L4 between the pivoting axis AX0 and the third rotation axis AX3 is substantially equal to the distance L5 between the third rotation axis AX3 and the fourth rotation axis AX4.

Thus, it is possible to move the first hand 21 straight along the first diameter direction D1 when the first arm 17 is extended/retracted. Similarly, it is possible to move the second hand 23 straight along the second diameter direction D2 when the second arm 19 is extended/retracted. As a result, the arms may stably transfer the workpiece W without, for example, vibrating in the horizontal direction, and the transfer distance and the transfer time may be minimized.

In the present embodiment, especially, in the pivoting posture, the robot controller 113 makes the distance L1 between the pivoting axis AX0 and the first rotation axis AX1, the distance L2 between the first rotation axis AX1 and the second rotation axis AX2, and the distance L3 between the second rotation axis AX2 and the pivoting axis AX0 substantially equal to each other, and makes the distance L4 between the pivoting axis AX0 and the third rotation axis AX3, the distance L5 between the third rotation axis AX3 and the fourth rotation axis AX4, and the distance L6 between the fourth rotation axis AX4 and the pivoting axis AX0 substantially equal to each other.

As a result, it is possible to minimize the pivoting radius "r" while maximizing the reach of each of the arms 17 and 19.

In the present embodiment, especially, the length of the first hand 21 in the elongated direction thereof is substantially twice the distance between the pivoting axis AX0 and the outer peripheral end of the first base link 29, and the length of the second hand 23 in the elongated direction thereof is substantially twice the distance between the pivoting axis AX0 and the outer peripheral end of the second base link 39.

As a result, the length of each of the first hand 21 and the second hand 23 may be substantially equal to the diameter of the pivoting circle TC which is the pivoting trajectory of each of the arms 17 and 19 in the pivoting posture (the length that uses the entire pivoting circle TC). Accordingly, the maximization of the reach of each of the arms 17 and 19 may be implemented to ensure the reach as long as possible.

In the present embodiment, especially, the robot 3 includes the base 27 provided with the three motors 91, 97, and 103 therein which are driving sources for the extension/retraction operation of the first arm 17, the extension/retraction operation of the second arm 19, and the pivoting operation of the first arm 17 and the second arm 19 by the pivoting device 24.

Since the motors 91, 97, and 103 that are driving sources for the extension/retraction operation and the pivoting operation of the first arm 17 and the second arm 19 are disposed inside the base 27, rather than inside the arms 17 and 19, each of the first arm 17 and the second arm 19 may only include the mechanisms for transmitting the power (e.g., the pulleys and the belts), and, as a result, may be formed into a compact (thin) size.

In the present embodiment, especially, the robot system 1 further includes the transfer chamber 5 in which the robot 3 is disposed, and the plurality of processing chambers 7 that are arranged around the transfer chamber 5, and the transfer chamber 5 includes the walls 26 arranged such that, when the robot 3 is pivoted by an angle at which one of the plurality of processing chambers 7 is positioned in front of the robot 3 in one direction of the first diameter direction D1 and the second diameter direction D2, one of the walls 26 is positioned in front of the robot 3 in the other direction.

In the present embodiment, since the angle difference θ between the first diameter direction D1 and the second diameter direction D2 may be designed without being restricted by the arrangement of the processing chambers 7, the degree of freedom in design may be improved.

In the present embodiment, especially, the transfer chamber 5 and the processing chambers 7 are depressurized to a pressure lower than the atmospheric pressure.

Thus, the robot system 1 of the present embodiment may be applied to, for example, manufacturing processes for processing and transferring the workpiece W under a vacuum environment, in a semiconductor manufacturing apparatus, a liquid crystal manufacturing apparatus or the like.

7. Example of Hardware Configuration of Controller

Figure 18:
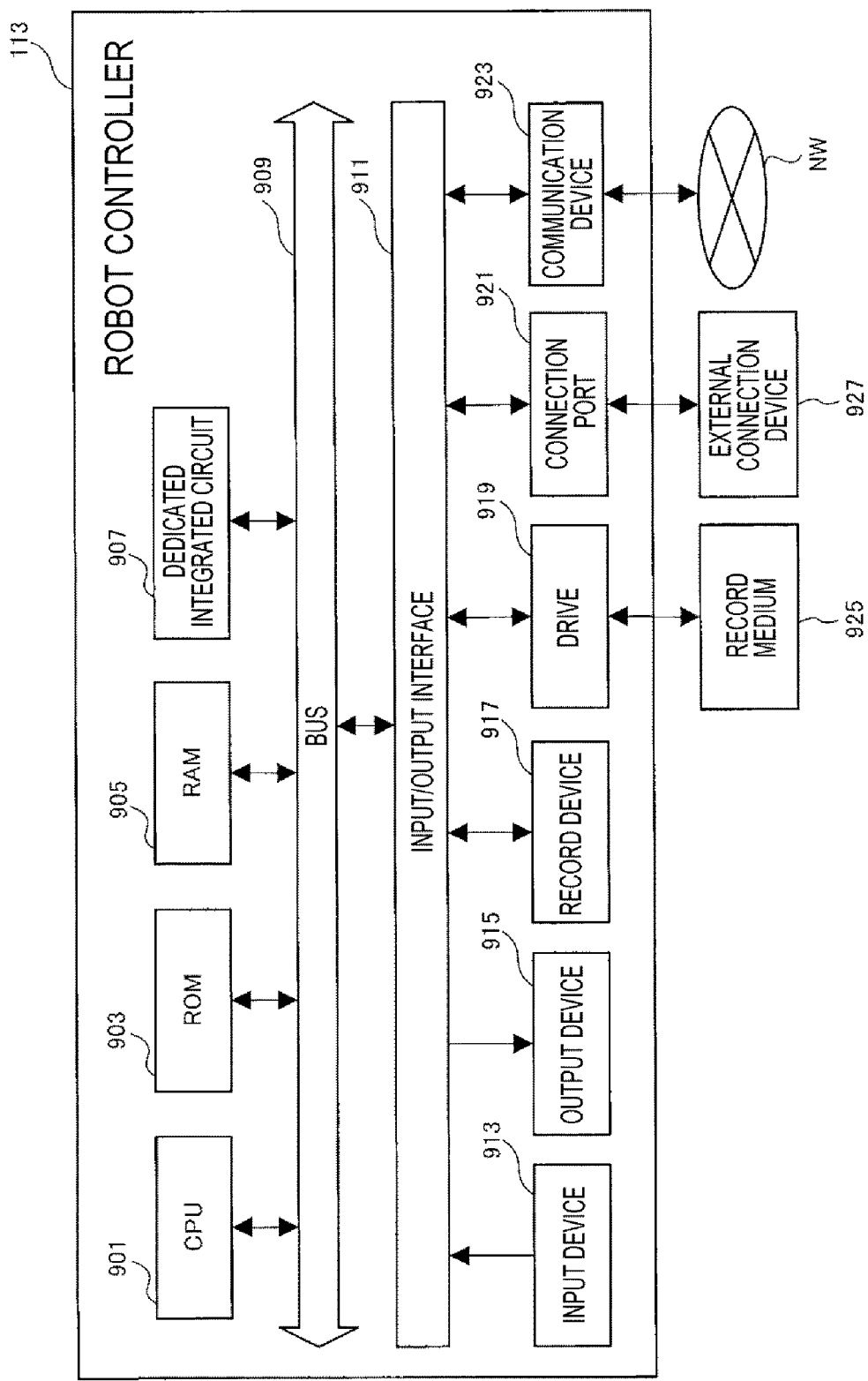
FIG. 18 is a block diagram illustrating an example of a hardware configuration of the robot controller.

Next, descriptions will be made on an example of a hardware configuration of the robot controller 113 that implements the process performed by, for example, each of the operation controllers 115, 117, and 119 mounted by the program executable by the CPU 901 as described above, with reference to FIG. 18. FIG. 18 appropriately omits the illustration of the configuration relating to the function of the robot controller 113 that supplies the driving power to each of the motors 91, 97, 103, and 111.

As illustrated in FIG. 18, the robot controller 113 includes, for example, the CPU 901, a ROM 903, a RAM 905, a dedicated integrated circuit 907 constructed for a specific application such as an ASIC or FPGA, an input device 913, an output device 915, a record device 917, a drive 919, a connection port 921, and a communication device 923. These components are connected to each other via a bus 909 or an input/output interface 911, so as to be able to transmit signals to each other.

The program may be recorded in, for example, the ROM 903, the RAM 905 or the record device 917 configured by a hard disk or the like.

The program may be temporarily or non-temporarily (e.g., permanently) recorded in a removable record medium 925, for example, a magnetic disk such as a flexible disk, various optical disks such as CD, an MO disk, and DVD, or a semiconductor memory. The record medium 925 may be provided as so-called package software. In this case, the program recorded in the record medium 925 may be read by the drive 919, and may be recorded in the record device 917 via, for example, the input/output interface 911 or the bus 909.

The program may be recorded in, for example, a download site, another computer or another record device (not illustrated). In this case, the program may be transmitted via a network NW such as a LAN or the Internet, and the communication device 923 receives the program. The program received by the communication device 923 may be recorded in the record device 917 via, for example, the input/output interface 911 or the bus 909.

The program may be recorded in, for example, an appropriate external connection device 927. In this case, the program may be transmitted via an appropriate connection port 921, and may be recorded in the record device 917 via, for example, the input/output interface 911 or the bus 909.

Then, when the CPU 901 executes various processes according to the program recorded in the record device 917, the processes by, for example, the first operation controller 115, the second operation controller 117, and the third operation controller 119 are implemented. At this time, the CPU 901 may directly read the program from the record device 917 and execute the program, or may temporarily load the program into the RAM 905 and then execute the program. For example, when the CPU 901 receives the program via the communication device 923, the drive 919 or the connection port 921, the CPU 901 may directly execute the received program without recording the program in the record device 917.

The CPU 901 may perform the various processes based on a signal or information input from the input device 913 such as a mouse, a keyboard or a microphone (not illustrated), as necessary.

Then, the CPU 901 may output the execution result of the processes from the output device 915 such as a display device or a voice output device, may transmit the execution result via the communication device 923 or the connection device 921 as necessary, and record the execution result in the record device 917 or the record medium 925.

In the descriptions above, for example, the terms "vertical," "parallel," and "plane" do not have strict meanings. That is, the terms "vertical," "parallel," and "plane" allow tolerances and errors in the design and manufacturing, and indicate "substantially vertical," "substantially parallel," and "substantially plane."

In the descriptions above, for example, the terms "similar," "same," "equal," and "different" in an external dimension or size, a shape, a position or the like do not have strict meanings. That is, the terms "similar," "same," "equal," and "different" allow tolerances and errors in design and manufacturing, and indicate "substantially similar," "substantially the same," "substantially equal," "substantially different."

According to the robot and others of the present disclosure, it is possible to minimize the pivoting radius while ensuring the reach of an arm.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A robot system comprising:
    a robot; and
    a robot controller configured to control the robot,
    wherein the robot includes
    a first arm that is a horizontal multi-joint arm provided with a first base link provided to be rotatable around a pivoting axis, a first intermediate link connected to a tip portion of the first base link to be rotatable around a first rotation axis, and a first hand connected to an upper surface of the first intermediate link at a tip portion of the first intermediate link to be rotatable around a second rotation axis and formed to be longer in an elongated direction of the first hand than each of the first base link and the first intermediate link thereby holding a workpiece thereon, and configured to move the first hand along a first diameter direction centered on the pivoting axis,
    a second arm that is a horizontal multi-joint arm provided with a second base link provided to be independently rotatable from the first base link around the pivoting axis, a second intermediate link connected to a tip portion of the second base link to be rotatable around a third rotation axis, and a second hand connected to a tip portion of the second intermediate link to be rotatable around a fourth rotation axis and formed to be longer in an elongated direction of the second hand than each of the second base link and the second intermediate link thereby holding the workpiece thereon, and configured to move the second hand along a second diameter direction having a preset angle in a circumferential direction of the pivoting axis with respect to the first diameter direction, and
    a base including a pivoting motor configured to pivot the first arm and the second arm together in the circumferential direction while maintaining a positional relationship of the first arm and the second arm in the circumferential direction,
    wherein the pivoting axis forms a central axis of the base, the second base link is positioned directly above the base, and the first base link is positioned above the second base link,
    wherein when the first arm and the second arm are pivoted by the pivoting motor, the robot controller brings the first arm and the second arm into a pivoting posture where the second rotation axis of the first hand is positioned opposite to a tip of the first hand with respect to the pivoting axis, and the fourth rotation axis of the second hand is positioned opposite to a tip of the second hand with respect to the pivoting axis, and
    wherein in the pivoting posture, the robot controller causes the second rotation axis to be positioned between the third rotation axis and the fourth rotation axis in the circumferential direction, and causes the fourth rotation axis to be positioned between the first rotation axis and the second rotation axis.

2. The robot system according to claim 1, further comprising:
    an elevation motor configured to move the first arm and the second arm together up and down in an axial direction of the pivoting axis while maintaining the positional relationship of the first arm and the second arm in the circumferential direction,
    wherein the robot controller controls the pivoting motor and the elevation motor to move the first arm and the second arm up and down in the axial direction, simultaneously with pivoting the first arm and the second arm in the circumferential direction.

3. The robot system according to claim 2, wherein the robot controller includes
    a first operation controller that extends/retracts the first arm to move the first hand along the first diameter direction,
    a second operation controller that controls the pivoting motor and the elevation motor to move the first arm and the second arm up and down in the axial direction, simultaneously with pivoting the first arm and the second arm in the circumferential direction, and
    a third operation controller that extends/retracts the second arm to move the second hand along the second diameter direction.

4. The robot system according to claim 3, wherein the second operation controller controls the pivoting motor and the elevation motor to move the first arm and the second arm up and down in the axial direction, simultaneously with pivoting the first arm and the second arm by the preset angle that is an angle difference between the first diameter direction and the second diameter direction.

5. The robot system according to claim 3, wherein
    the first hand and the second hand are disposed to be offset from each other in the axial direction, and
    the second operation controller controls the pivoting motor and the elevation motor to move the first arm and the second arm up and down by a distance of the offset in the axial direction, simultaneously with pivoting the first arm and the second arm in the circumferential direction.

6. The robot system according to claim 1, wherein in the pivoting posture, the robot controller causes the first hand to be positioned in a direction along the first diameter direction, and causes the second hand to be positioned in a direction along the second diameter direction.

7. The robot system according to claim 1, wherein
    the first arm is configured such that a distance between the pivoting axis and the first rotation axis is substantially equal to a distance between the first rotation axis and the second rotation axis, and
    the second arm is configured such that a distance between the pivoting axis and the third rotation axis is substantially equal to a distance between the third rotation axis and the fourth rotation axis.

8. The robot system according to claim 7, wherein in the pivoting posture, the robot controller makes the distance between the pivoting axis and the first rotation axis, the distance between the first rotation axis and the second rotation axis, and the distance between the second rotation axis and the pivoting axis substantially equal to each other, and makes the distance between the pivoting axis and the third rotation axis, the distance between the third rotation axis and the fourth rotation axis, and the distance between the fourth rotation axis and the pivoting axis substantially equal to each other.

9. The robot system according to claim 1, wherein
a length of the first hand in the elongated direction is substantially twice a distance between the pivoting axis and an outer peripheral end of the first base link, and
a length of the second hand in the elongated direction is substantially twice a distance between the pivoting axis and an outer peripheral end of the second base link.

10. The robot system according to claim 1, wherein the pivoting motor includes three motors therein that are driving sources for an extension/retraction operation of the first arm, an extension/retraction operation of the second arm, and the pivoting operation of the first arm and the second arm by the pivoting motor.

11. The robot system according to claim 1, further comprising:
a first chamber in which the robot is disposed; and
a plurality of second chambers arranged around the first chamber,
wherein the first chamber includes a wall disposed such that when the robot is pivoted by an angle at which one chamber of the plurality of second chambers is positioned in front of the robot in one direction of the first diameter direction and the second diameter direction, the wall is positioned in front of the robot in the other direction.

12. The robot system according to claim 11, wherein the first chamber and the second chambers are depressurized to a pressure lower than an atmospheric pressure.

13. A method of controlling a robot, the method comprising:
preparing a robot including
a first arm that is a horizontal multi-joint arm provided with a first base link provided to be rotatable around a pivoting axis, a first intermediate link connected to a tip portion of the first base link to be rotatable around a first rotation axis, and a first hand connected to an upper surface of the first intermediate link at a tip portion of the first intermediate link to be rotatable around a second rotation axis and formed to be longer in an elongated direction of the first hand than each of the first base link and the first intermediate link thereby holding a workpiece thereon, and configured to move the first hand along a first diameter direction centered on the pivoting axis,
a second arm that is a horizontal multi-joint arm provided with a second base link provided to be independently rotatable from the first base link around the pivoting axis, a second intermediate link connected to a tip portion of the second base link to be rotatable around a third rotation axis, and a second hand connected to a tip portion of the second intermediate link to be rotatable around a fourth rotation axis and formed to be longer in an elongated direction of the second hand than each of the second base link and the second intermediate link thereby holding the workpiece thereon, and configured to move the second hand along a second diameter direction having a preset angle in a circumferential direction of the pivoting axis with respect to the first diameter direction,
a base including a pivoting motor configured to pivot the first arm and the second arm together in the circumferential direction while maintaining a positional relationship of the first arm and the second arm in the circumferential direction, and
an elevation motor configured to move the first arm and the second arm together up and down in an axial direction of the pivoting axis while maintaining the positional relationship of the first arm and the second arm in the circumferential direction; and
moving the first arm and the second arm up and down in the axial direction, simultaneously with pivoting the first arm and the second arm in the circumferential direction,
wherein the pivoting axis forms a central axis of the base, the second base link is positioned directly above the base, and the first base link is positioned above the second base link,
wherein when the first arm and the second arm are pivoted by the pivoting motor, the first arm and the second arm are brought into a pivoting posture where the second rotation axis of the first hand is positioned opposite to a tip of the first hand with respect to the pivoting axis, and the fourth rotation axis of the second hand is positioned opposite to a tip of the second hand with respect to the pivoting axis, and
wherein in the pivoting posture, the second rotation axis is positioned between the third rotation axis and the fourth rotation axis in the circumferential direction, and the fourth rotation axis is positioned between the first rotation axis and the second rotation axis.

14. A semiconductor manufacturing system comprising:
a first chamber in which a robot for transferring a semiconductor wafer is disposed;
a robot controller configured to control the robot; and
a plurality of second chambers arranged around the first chamber and configured to perform a preset processing on the semiconductor wafer,
wherein the robot includes
a first arm that is a horizontal multi-joint arm provided with a first base link provided to be rotatable around a pivoting axis, a first intermediate link connected to a tip portion of the first base link to be rotatable around a first rotation axis and a first hand connected to an upper surface of the first intermediate link at a tip portion of the first intermediate link to be rotatable around a second rotation axis and formed to be longer in an elongated direction of the first hand than each of the first base link and the first intermediate link thereby holding a workpiece thereon, and configured to move the first hand along a first diameter direction centered on the pivoting axis,
a second arm that is a horizontal multi-joint arm provided with a second base link provided to be independently rotatable from the first base link around the pivoting axis, a second intermediate link connected to a tip portion of the second base link to be rotatable around a third rotation axis, and a second hand connected to a tip portion of the second intermediate link to be rotatable around a fourth rotation axis and formed to be longer in an elongated direction of the second hand than each of the second base link and the second intermediate link thereby holding the workpiece thereon, and configured to move the second hand along a second diameter direction having a preset angle in a circumferential direction of the pivoting axis with respect to the first diameter direction, and a base including a pivoting motor configured to pivot the first arm and the second arm together in the circumferential direction while maintaining a positional relationship of the first arm and the second arm in the circumferential direction, wherein the pivoting axis forms a central axis of the base, the second base link is positioned directly above the base, and the first base link is positioned above the second base link, wherein when the first arm and the second arm are pivoted by the pivoting motor, the robot controller brings the first arm and the second arm into a pivoting posture where the second rotation axis of the first hand is positioned opposite to a tip of the first hand with respect to the pivoting axis, and the fourth rotation axis of the second hand is positioned opposite to a tip of the second hand with respect to the pivoting axis, and wherein in the pivoting posture, the robot controller causes the second rotation axis to be positioned between the third rotation axis and the fourth rotation axis in the circumferential direction, and causes the fourth rotation axis to be positioned between the first rotation axis and the second rotation axis.

15. A robot comprising:

a first arm including a first base link provided to be rotatable around the pivoting axis, a first intermediate link connected to a tip portion of the first base link to be rotatable around a first rotation axis, and a first hand connected to a tip portion of the first intermediate link to be rotatable around a second rotation axis and formed to be longer in an elongated direction of the first hand than each of the first base link and the first intermediate link thereby holding a workpiece thereon, and configured to move the first hand along a first diameter direction centered on a pivoting axis;

a second arm including a second base link provided to be independently rotatable from the first base link around the pivoting axis, a second intermediate link connected to a tip portion of the second base link to be rotatable around a third rotation axis, and a second hand connected to a tip portion of the second intermediate link to be rotatable around a fourth rotation axis and formed to be longer in an elongated direction of the second hand than each of the second base link and the second intermediate link thereby holding the workpiece thereon, and configured to move the second hand along a second diameter direction having a preset angle in a circumferential direction of the pivoting axis with respect to the first diameter direction;

a base including a pivoting motor configured to pivot the first arm and the second arm together in the circumferential direction while maintaining a positional relationship of the first arm and the second arm in the circumferential direction; and an elevation motor configured to move the first arm and the second arm together up and down by a vertical offset distance in an axial direction of the pivoting axis while maintaining the positional relationship of the first arm and the second arm in the circumferential direction, wherein the pivoting axis forms a central axis of the base, and the preset angle is set to an angle difference that corresponds to a range in which the first arm and the second arm are pivoted during a time required to move the first arm and the second arm by the vertical offset distance, wherein when the first arm and the second arm are pivoted by the pivoting motor, the first arm and the second arm are brought into a pivoting posture where the second rotation axis of the first hand is positioned opposite to a tip of the first hand with respect to the pivoting axis, and the fourth rotation axis of the second hand is positioned opposite to a tip of the second hand with respect to the pivoting axis, and wherein in the pivoting posture, the second rotation axis is positioned between the third rotation axis and the fourth rotation axis in the circumferential direction, and the fourth rotation axis is positioned between the first rotation axis and the second rotation axis.

16. The robot according to claim 15, wherein the pivoting motor pivots the first arm and the second arm together in the circumferential direction while maintaining an angle difference between the first diameter direction and the second diameter direction to be the preset angle.

* * * * *